(12) United States Patent
Saito et al.

(10) Patent No.: US 7,211,517 B2
(45) Date of Patent: May 1, 2007

(54) SEMICONDUCTOR DEVICE AND METHOD THAT INCLUDES REVERSE TAPERING MULTIPLE LAYERS

(75) Inventors: Yukishige Saito, Tokyo (JP); Risho Koh, Tokyo (JP); Jyonu Ri, Tokyo (JP); Hisashi Takemura, Tokyo (JP)

(73) Assignee: NEC Corporation, Tokyo (JP)

( * ) Notice: Subject to any disclaimer, the term of this patent is extended or adjusted under 35 U.S.C. 154(b) by 73 days.

(21) Appl. No.: 10/476,978

(22) PCT Filed: Sep. 5, 2002

(86) PCT No.: PCT/JP02/09043

§ 371 (c)(1),
(2), (4) Date: May 11, 2004

(87) PCT Pub. No.: WO03/023865

PCT Pub. Date: Mar. 20, 2003

(65) Prior Publication Data

US 2004/0209438 A1    Oct. 21, 2004

(30) Foreign Application Priority Data

Sep. 10, 2001  (JP) .............................. 2001-272982

(51) Int. Cl.
*H01L 21/311* (2006.01)

(52) U.S. Cl. ...................... 438/700; 438/701; 438/713; 438/978; 257/E21.214; 257/347

(58) Field of Classification Search ................ 438/700, 438/701, 713, 978; 257/E21.214, E21.218, 257/E21.233, 347
See application file for complete search history.

(56) References Cited

U.S. PATENT DOCUMENTS 4,799,991 A * 1/1989 Dockrey ..................... 438/719

(Continued)

FOREIGN PATENT DOCUMENTS

CN        129 7256 A      5/2001

(Continued)

OTHER PUBLICATIONS

Translation of the International Preliminary Examination Report dated May 19, 2003 for PCT/JP02/09043.

(Continued)

*Primary Examiner*—Michael Lebentritt
*Assistant Examiner*—Stanetta Isaac
(74) *Attorney, Agent, or Firm*—McGinn IP Law Group, PLLC

(57) ABSTRACT

A method of manufacturing a semiconductor device of the present invention includes (a) sequentially forming a gate insulating film 14, a first conductive layer 15 and a first insulating film 16 on a semiconductor layer 13 provided on an insulating film 12; (b) selectively removing the semiconductor layer, the gate insulating film, the first conductive layer and the first insulating film to form a device isolation trench; (c) forming a second insulating film 17 in the device isolation [element separation] trench, wherein a height of an upper surface of the second insulating film is substantially coincident with that of an upper surface of the first insulating film; (d) removing a part of the second insulating film and the first insulating film such that a height of an upper surface of the exposed first conductive layer is substantially coincident with that of the top surface of the second insulating film; and (e) patterning the first conductive layer to form a gate electrode.

20 Claims, 20 Drawing Sheets

U.S. PATENT DOCUMENTS

| | | | |
|---|---|---|---|
| 5,094,712 A * | 3/1992 | Becker et al. | 438/721 |
| 5,126,817 A | 6/1992 | Baba et al. | |
| 5,767,018 A * | 6/1998 | Bell | 438/696 |
| 5,854,509 A * | 12/1998 | Kunikiyo | 257/506 |
| 5,874,363 A * | 2/1999 | Hoh et al. | 438/721 |
| 5,880,035 A * | 3/1999 | Fukuda | 438/734 |
| 5,926,725 A * | 7/1999 | Saihara et al. | 438/481 |
| 6,146,542 A * | 11/2000 | Ha et al. | 216/2 |
| 6,312,616 B1 * | 11/2001 | Chinn et al. | 216/68 |
| 6,599,813 B2 * | 7/2003 | Beyer et al. | 438/424 |
| 6,627,510 B1 * | 9/2003 | Evans et al. | 438/401 |
| 6,905,800 B1 * | 6/2005 | Yuen et al. | 430/5 |

FOREIGN PATENT DOCUMENTS

| | | |
|---|---|---|
| JP | 11-67895 | 3/1999 |
| JP | 11-74538 | 3/1999 |
| JP | 2001-24202 | 1/2001 |
| JP | 2001-144175 | 5/2001 |

OTHER PUBLICATIONS

Chinese Office Action dated Jul. 22, 2005 with English translation.

* cited by examiner

SEMICONDUCTOR DEVICE AND METHOD THAT INCLUDES REVERSE TAPERING MULTIPLE LAYERS

TECHNICAL FIELD

The present invention relates to a semiconductor device and a method of manufacturing the same, and more particularly, relates to a structure of a semiconductor device using an SOI (Silicon On Insulator) substrate that has a single crystal semiconductor layer formed through a buried oxide film on a semiconductor substrate, and an element separating method.

BACKGROUND ART

The request of a miniaturization and high density fabrication of LSI has become much severer, and a sub 100-nm generation has come. On the other hand, the request of a low power consumption and high speed operation has been increased. It becomes difficult to satisfy those requests by using a conventional bulk substrate.

MISFET (Metal-Insulator-Semiconductor Field Effect Transistor) formed on an SOI substrate is expected as a ULSI element in the sub 100-nm generation, since junction capacitances in source and drain regions are small, a substrate bias effect is low and a sub-threshold characteristic is excellent, as compared with conventional MISFET formed on a bulk substrate.

The SOI-MISFET is grouped into two kinds of operation modes of a fully-depleted SOI-MISFET (hereafter, referred to as an FD-type SOI-MISFET) and a partially-depleted SOI-MISFET (hereafter, referred to as PD-SOI-MISFET). In the FD-type SOI-MISFET, the film thickness of a SOI layer is thinner than a maximum depletion layer (a body region is always in a depleted state), whereas in the PD-type SOI-MISFET, the film thickness of the SOI layer is thicker than a maximum depletion layer. In particular, the FD-type SOI-MISFET could be expected as the ULSI element having a low voltage operation and an excellent ultra high speed operation since a sharp sub-threshold characteristic can be obtained. In the FD-type SOI-MISFET in the sub 100 nm generation, the film thickness of a silicon layer on an SOI substrate is reduced to about 10 nm or less.

A method of manufacturing a conventional SOI-MISFET will be described below.

At first, a case that a shallow trench isolation (hereafter, referred to as STI) is applied to a typical MISFET on a bulk substrate will be described with reference to sectional views of FIGS. 1A to 2B (hereafter, referred to as a first conventional example). An SOI substrate is provided which has a silicon substrate 51, a buried oxide film 52 and a silicon film 53 (FIG. 1A). A pad oxide film 54 having the film thickness of about 5 nm and a stopper nitride film 55 of about 120 nm are sequentially deposited. Then, by using a photo-lithography and a reactive ion etching (hereafter, referred to as RIE) method, the stopper nitride film 55, the pad oxide film 54 and the silicon film 53 are patterned to an island shape, and element isolation trenches are formed (FIG. 1B). Subsequently, an STI embedded insulating film 57 is deposited, and a chemical mechanical polishing (hereafter, referred to as CMP) method is used to flatten the STI embedded insulating film 57 (FIG. 1C).

Next, the stopper nitride film 55 is removed by wet etching of hot phosphoric acid, and the pad oxide film 54 is removed by wet etching of fluoric acid, such that the silicon film 53 is exposed (FIG. 1D). At this time, the buried oxide film 52 in the lower portion of the silicon film 53 is over-etched 59. Then, a gate insulating film 60 is formed, and a polysilicon film 61 is deposited, and then is patterned to form a gate electrode (FIG. 2A). Subsequently, side wall insulating films 63, source and drain regions 64 and a silicide film 65 are formed, and an interlayer insulating film 66 is deposited. Then, contact holes are opened, and metal wirings 67 are formed. Thus, the MISFET is formed (FIG. 2B). FIG. 2C is a plan view showing the MISFET. FIGS. 1A to 2B are sectional views of the MISFET along a line A–A' of FIG. 2C.

FIGS. 3A to 3D are sectional views showing a method of forming an element insulation region disclosed in Japanese Laid Open Patent Application (JP-A 2001-24202) (hereafter, referred to as a second conventional example). A gate insulating film 68 and a first polysilicon film 70 are deposited in this order on the surface of the silicon film of the SOI substrate in which the buried oxide film 52 and the silicon film 53 are laminated on a silicon substrate 51. Then, the first polysilicon film 70, the gate insulating film 68 and the silicon film 53 are patterned by using a same mask (FIG. 3A). Subsequently, an STI embedded insulating film 69 is deposited on the entire surface, and is flattened by using a CMP method (FIG. 3B).

Next, a second polysilicon film 71 is deposited on the entire surface, and a mask pattern 58 of photo resist is formed (FIG. 3C). By using this mask pattern 58, the second polysilicon film 71, the first polysilicon film 40 and the gate insulating film 68 are patterned by a RIE method. Here, the first polysilicon film 70 functions as a gate electrode 70a, and the second polysilicon film 71 functions as a gate electrode wiring line 71a through which gate electrodes of transistors adjacent to each other are connected. Subsequently, source and drain regions 64 are formed by ion implantation. Thus, the structure of FIG. 3D is obtained.

In the SOI-MISFET, it is known that the exposure of ends 72 of an element region causes a leak current to flow. However, according to this element insulation method, the side of the silicon film 53 on which the element is formed is covered with the STI embedded insulating film 69. Thus, the ends 72 of the element region are not exposed, and the leak current is suppressed (it should be noted that the location where the leak current is generated is the end existing in a direction perpendicular to FIG. 3D, but it is shown in FIG. 3D for the illustrative convenience).

A typical film thickness of a silicon film is about 10 nm in a higher density generation. However, if the STI structure is applied to the SOI-MISFET having such a thin silicon film, there are the following problems in the first conventional example. After the formation of the shape shown in FIG. 1C, the stopper nitride film 55 is removed by the wet etching method of the hot phosphoric acid, and the pad oxide film 54 is further removed by the wet etching method of HF. At this time, the STI embedded insulating film 57 is also etched by HF at the same time. Thus, as shown in FIG. 1D, the buried oxide film 52 under the silicon film 53 is over-etched (numeral 59 of FIG. 1D). In particular, if the silicon film 53 is thin (for example, in a case of 10 nm), when the pad oxide film 54 is etched, the entire STI embedded insulating film 57 on the side of the silicon film 53 is easily lost through the etching. Therefore, the over-etching 59 is extremely easily caused in the lower corner of the end of the silicon film 53.

Moreover, the gate insulating film 60 is formed in the state that the buried oxide film 52 at the lower corner of the end of the silicon film 53 is over-etched. Then, the polysilicon film 61 is deposited. Subsequently, when the polysilicon film 61 is patterned, a residual polysilicon film 62 is left in the over-etched portion 59 (FIG. 2A).

As shown in the plan view of FIG. 2C, the residual polysilicon film 62 is formed to surround an active region (an island region). This results in the connection between the residual polysilicon film 62 and the polysilicon film 61 on a B–B' section. At this time, if two or more gate electrodes are arranged in parallel to each other, the gate electrodes are short-circuited to each other through the residual polysilicon film 62. In addition, a capacitance generated between the residual polysilicon film 62 and each of the source and drain regions 64 functions as a parasitic capacitance connected in parallel to the gate capacitance. This increases a load on the circuit to decrease the operation speed. Also, if the insulation characteristic of the gate insulating film 60 is deteriorated due to the damage caused by the ion implantation to form the source and drain regions 64, there may be a possibility that an electric short-circuit is caused between the gate electrode and the each of the source and drain regions 64 through the residual polysilicon film 62.

Also, if the formation of the over-etched portion 59 causes the element end to be exposed, a leak current easily flows in the end (numeral 72 of FIG. 3D) of the element region.

Moreover, in the first conventional example, the end of the element region is exposed so that the gate electrode is formed to cover the side of the element region. Therefore, the electric field applied to the silicon film from the gate electrode is increased. Thus, the reverse narrow channel effect becomes severe to decrease the threshold through the miniaturization.

In order to prevent the above-mentioned over-etching, it could be considered to strictly control the wet etching of the pad oxide film 54 by HF, although this control is very difficult actually. At this time, a step will be generated as shown in FIG. 4. This is because the film thickness of the pad oxide film 54 is very thinner than that of the STI embedded insulating film 57. Also, if the wet etching with HF is continued in order to remove this step, the above-mentioned over-etched portion would be generated.

Here, the problem when the step is generated will be described with reference to FIG. 5. In case of the existence of such a step, when the polysilicon film 61 is deposited (FIG. 5A) after the formation of the gate insulating film 60, and the gate electrode is formed by etching this polysilicon film 61 by the RIE method, non-etched polysilicon films 62 is remained in the step portions (FIG. 5B). This residual polysilicon film 62 acts as a cause of short circuit between the polysilicon films or between the gate electrode and each of the source and drain regions. Also, such a step deteriorates the shape of a resist pattern for a gate electrode in a lithography step.

Also, in the second conventional example, if a polishing operation is carried out by the CMP method in order to process as shown in FIG. 3B, the first polysilicon film 70 is polished deeper than the STI embedded insulating film 69, because a polishing rate of the polysilicon film is typically larger than a polishing rate of the oxide film. This results in the formation of a step (FIG. 6A). Moreover, the first polysilicon film 70 can not function as a stopper to the polishing operation in the CMP method. Therefore, if the polysilicon film is a thin film, there may be a possibility that the polysilicon film is perfectly lost (FIG. 6B).

By the way, a semiconductor device is disclosed in Japanese Laid Open Patent Application (JP-A-Heisei 11-74538). The semiconductor device of this conventional example has a substrate having an insulating layer. A first conductive type semiconductor layer is formed on the insulating layer such that a part of the semiconductor layer functions as a channel region. A gate insulating film is formed on the channel region of the semiconductor layer, and a gate electrode is formed on the gate insulating layer. A second conductive type source and drain regions are respectively formed on both sides of the channel region within the semiconductor layer. A hole removing region is formed in a region within the semiconductor layer, and the hole removing region is adjacent to the channel region and at least one region of the source region and the drain region, and has a function of preventing the accumulation of a hole of a pair of a hole and an electron generated in the channel region.

Also, a SOI device is disclosed in Japanese Laid Open Patent Application (JP-A 2001-24202). The SOI device of this conventional example contains an SOI substrate constituted of a lamination structure of a base substrate, a buried oxide film and a semiconductor layer. An oxide film is formed so as to be in contact with the buried oxide film in a semiconductor portion of a field region so as to determine an active region. Each of gate electrode patterns has a gate oxide film formed only on the active region, and source and drain regions are formed within the active regions of the semiconductor layer on both sides of the gate electrode pattern. A gate electrode line is formed on the gate electrode pattern and the field region to connect the gate electrode patterns formed on the respective aligned active regions.

Also, a separation structure of a semiconductor device is disclosed in Japanese Laid Open Patent Application (JP-A-Heisei, 11-67895). The separation structure of the semiconductor device includes a semiconductor substrate having an active region and a field region. A buried insulating layer is formed in a predetermined depth within the active region of the semiconductor substrate, and a separation layer is formed in a position deeper than the buried insulating layer within the field region of the semiconductor substrate.

DISCLOSURE OF INVENTION

Therefore, a subject of the present invention is to solve the above-mentioned problems. Therefore, an object of the present invention is firstly not to expose an element region end, secondly not to generate a residual polysilicon, and thirdly not to damage or lose a polysilicon film as a gate electrode.

A method of manufacturing a semiconductor device in the present invention includes the steps of: (a) sequentially forming a gate insulating film, a first conductive layer and a first insulating film on a semiconductor layer of an insulating film; (b) selectively removing the semiconductor layer, the gate insulating film, the first conductive layer and the first insulating film and forming a device isolation trench; (c) forming a second insulating film on the device isolation trench wherein a height of an upper surface of the second insulating film substantially coincides with a height of an upper surface of the first insulating film; (d) removing a part of the second insulating film and the first insulating film and making a height of an upper surface of the exposed first conductive layer substantially coincide with the height of the top surface of the second insulating film; and (e) patterning the first conductive layer and forming a gate electrode.

In a method of manufacturing a semiconductor device in the present invention, the step (d) is done by using RIE (Reactive Ion Etching).

In the method of manufacturing the semiconductor device in the present invention, at the step (d), the removal of the part of the second insulating film is done by the RIE, and the removal of the first insulating film is done by wet etching.

In a method of manufacturing a semiconductor device in the present invention, it further includes the step of (f) forming a second conductive layer on the first conductive layer after the step (d), and at the step (e), the first conductive layer and the second conductive layer are patterned to thereby form a gate electrode and a gate pulling wiring pulled out from the gate electrode.

A method of manufacturing a semiconductor device in the present invention includes the steps of: (g) sequentially forming a gate insulating film, a first conductive layer and a first insulating film on a semiconductor layer of an insulating film; (h) selectively removing the semiconductor layer, the gate insulating film, the first conductive layer and the first insulating film and forming a device isolation trench; (i) forming a second insulating film on the device isolation trench wherein a height of an upper surface of the second insulating film substantially coincides with a height of an upper surface of the first insulating film; (j) removing the first insulating film and exposing a surface of the first conductive layer; (k) depositing a second conductive layer on the first conductive layer and the second insulating film; (l) flattening the second conductive layer; and (m) patterning the second conductive layer and the first conductive layer and forming a gate electrode.

In a method of manufacturing a semiconductor device in the present invention, the step (l) is done by a CMP (Chemical Mechanical Polishing) method using the second insulating film as a stopper film.

In a method of manufacturing a semiconductor device in the present invention, it further includes the step of (n) of forming a third conductive layer on the second conductive layer after the step (l), and at the step (m), the second conductive layer, the first conductive layer and the third conductive layer are patterned to thereby form a gate electrode and a gate pulling wiring pulled out from the gate electrode.

In a method of manufacturing a semiconductor device in the present invention, the (b) or (h) is done such that an angle between a side and a bottom of the first conductive layer is obtuse.

In a method of manufacturing a semiconductor device in the present invention, the (b) or (h) is done such that an angle between a side and a bottom of the first conductive layer and an angle between a side and a bottom of the semiconductor layer are respectively obtuse.

In a method of manufacturing a semiconductor device in the present invention, the (b) or (h) is done such that an angle between a side and a bottom of the first conductive layer and an angle between a side and a bottom of the first insulating film are respectively obtuse.

In a method of manufacturing a semiconductor device in the present invention, the (b) or (h) is done such that an angle between a side and a bottom of the first conductive layer is a right angle.

In a method of manufacturing a semiconductor device in the present invention, the (b) or (h) includes the operation for performing the RIE on the semiconductor layer, the gate insulating film, the first conductive layer and the first insulating film.

In a method of manufacturing a semiconductor device in the present invention, the (b) or (h) is done by an etching operation for using $HBr$—$Cl_2$—$O_2$—$SF_6$ system-gas.

In a method of manufacturing a semiconductor device in the present invention, the etching at the (b) or (h) is done by controlling the inclinations of the respective sides of the semiconductor layer, the gate insulating film, the first conductive layer and the first insulating film since a flow rate of $O_2$ is adjusted.

In a method of manufacturing a semiconductor device in the present invention, the (c) or (i) includes the step of flattening the second insulating film by using the CMP method.

In a method of manufacturing a semiconductor device in the present invention, the first insulating film is a silicon nitride film, and the second insulating film is a silicon oxide film.

In a method of manufacturing a semiconductor device in the present invention, the first conductive layer or the second conductive layer is made of poly-silicon.

A semiconductor device in the present invention is a semiconductor device in which a semiconductor layer is formed on an insulating film, wherein the insulating film is not in contact with a conductive layer to form a gate electrode, and all of device isolation insulating films formed on the insulating film are in contact with an insulator.

A semiconductor device in the present invention is a semiconductor device in which a semiconductor layer is formed on an insulating film, wherein the insulating film is not in contact with a conductive layer to form a gate electrode, and a device isolation insulating film is not in contact with a conductive layer to form the gate electrode.

A semiconductor device in the present invention is a semiconductor device in which a semiconductor layer is formed on an insulating film, wherein the insulating film is not in contact with an insulating film to form a gate insulating film, and all of device isolation insulating films formed on the insulating film are in contact with an insulator.

A semiconductor device in the present invention is a semiconductor device in which a semiconductor layer is formed on an insulating film, wherein the insulating film is not in contact with an insulating film to form a gate insulating film, and a device isolation insulating film is not in contact with a conductive layer to form the gate electrode.

A semiconductor device in the present invention is a semiconductor device in which a semiconductor layer is formed on an insulating film, wherein the semiconductor layer is not in contact with an insulating film to form a gate insulating film, and all of device isolation insulating films formed on the insulating film are in contact with an insulator.

A semiconductor device in the present invention is a semiconductor device in which a semiconductor layer is formed on an insulating film, wherein the semiconductor layer is not in contact with an insulating film to form a gate insulating film, and a device isolation insulating film is not in contact with a conductive layer to form the gate electrode.

In a semiconductor device in the present invention, an angle between a bottom of the semiconductor layer and a side in contact with a device isolation insulating film of the semiconductor layer is obtuse.

In a semiconductor device in the present invention, a height of an upper surface of the device isolation insulating film and a height of an upper surface of a gate electrode are substantially equal to each other.

In a semiconductor device in the present invention, the gate electrode is provided with a first conductive material layer and a second conductive material layer formed on an upper portion of the first conductive material layer.

In a semiconductor device in the present invention, a height of an upper surface of the gate electrode and a height of an upper surface of the device isolation insulating film are substantially equal to each other.

In a semiconductor device in the present invention, the semiconductor device is an SOI (Silicon On Insulator) device, and the insulating film is a buried insulating film, and the semiconductor layer is a silicon film.

A semiconductor device in the present invention includes: a semiconductor layer having a source drain region and a channel region patterned in an island shape on an insulating film; a gate electrode formed through a gate insulating film on an upper portion of the semiconductor layer that is the channel region; and a device isolation insulating film formed so as to surround the semiconductor layer on the insulating film, in which its top surface is protruded upwardly from an upper surface of the semiconductor layer, wherein a side of the gate electrode in contact with a side of the device isolation insulating film is formed in a reverse tapered shape.

In a semiconductor device in the present invention, a side of the semiconductor layer is formed in a reverse tapered shape.

In a semiconductor device in the present invention, a gate electrode pulling wiring, which is in contact with an upper surface of the gate electrode and extended on an upper surface of the device isolation insulating film, is formed.

In a semiconductor device in the present invention, a first conductive material layer constitutes the gate electrode and a second conductive material layer formed thereon.

In a semiconductor device in the present invention, a height of an upper surface of the device isolation insulating film and a height of an upper surface of the gate electrode are substantially equal to each other.

In a semiconductor device in the present invention, the insulating film and the semiconductor layer are a buried insulating film of an SOI substrate and a silicon film formed thereon.

BEST MODE FOR CARRYING OUT THE INVENTION

Embodiments of the present invention will be described below with reference to the drawings.

(First Embodiment)

Figure 7A:
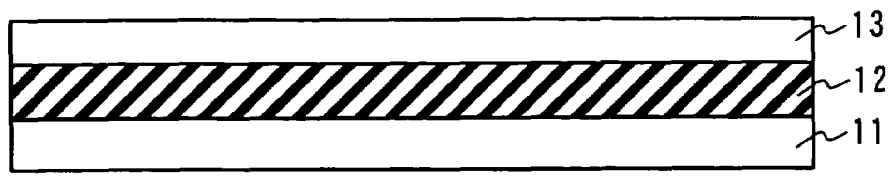
FIG. 7A is a step order sectional view showing a manufacturing method in a first embodiment of the present invention.
Figure 7B:
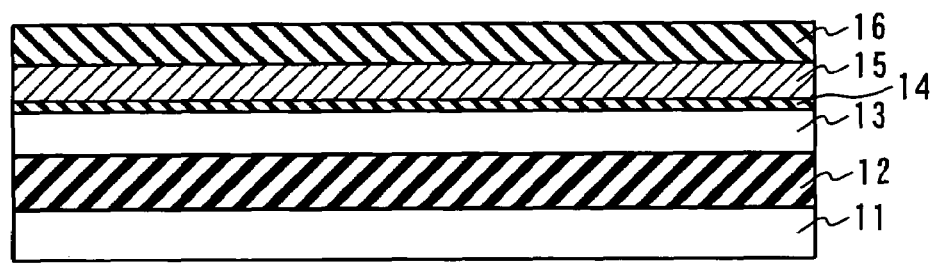
FIG. 7B is another step order sectional view showing a manufacturing method in a first embodiment of the present invention.
Figure 7C:
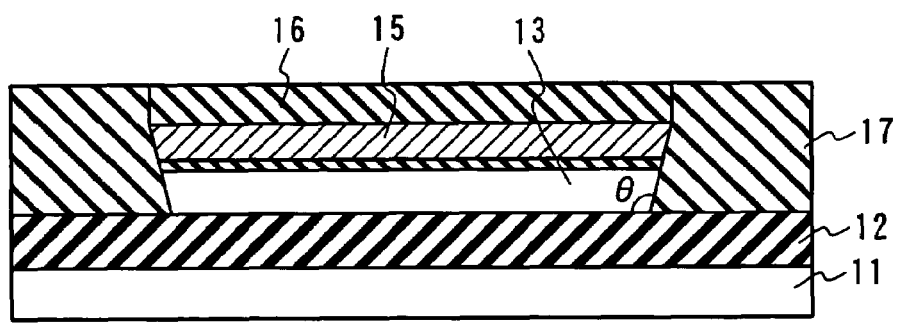
FIG. 7C is still another step order sectional view showing a manufacturing method in a first embodiment of the present invention.

FIGS. 7A to 7C are sectional views showing a manufacturing method in a first embodiment of the present invention.

At first, as shown in FIG. 7A, an SOI substrate composed of a silicon substrate 11, a buried oxide film 12 and a silicon film 13 is prepared. Here, the film thickness of the silicon film 13 is as very thin as 10 nm. A gate insulating film 14, a first polysilicon film 15 and a stopper nitride film 16 are deposited on this silicon film 13 in this order (FIG. 7B).

Next, the stopper nitride film 16, the first polysilicon film 15, the gate insulating film 14 and the silicon film 13 are etched to form device isolation trenches in such a way that an etching end plane is vertical in the stopper nitride film 16 and has a reverse tapered plane in the first polysilicon film 15, the gate insulating film 14 and the silicon film 13 (i.e., an angle between a bottom plane and a side plane of the silicon film 13 is obtuse). Subsequently, an STI embedded insulating film 17 is deposited, and the STI embedded insulating film 17 is flattened by a CMP method (FIG. 7C). In this case, the stopper nitride film 16, which is formed on the first polysilicon film 15, functions as a stopper in a CMP step. Thus, the first polysilicon film 15 used to form the gate electrode is never damaged in the CMP step.

Figure 9:
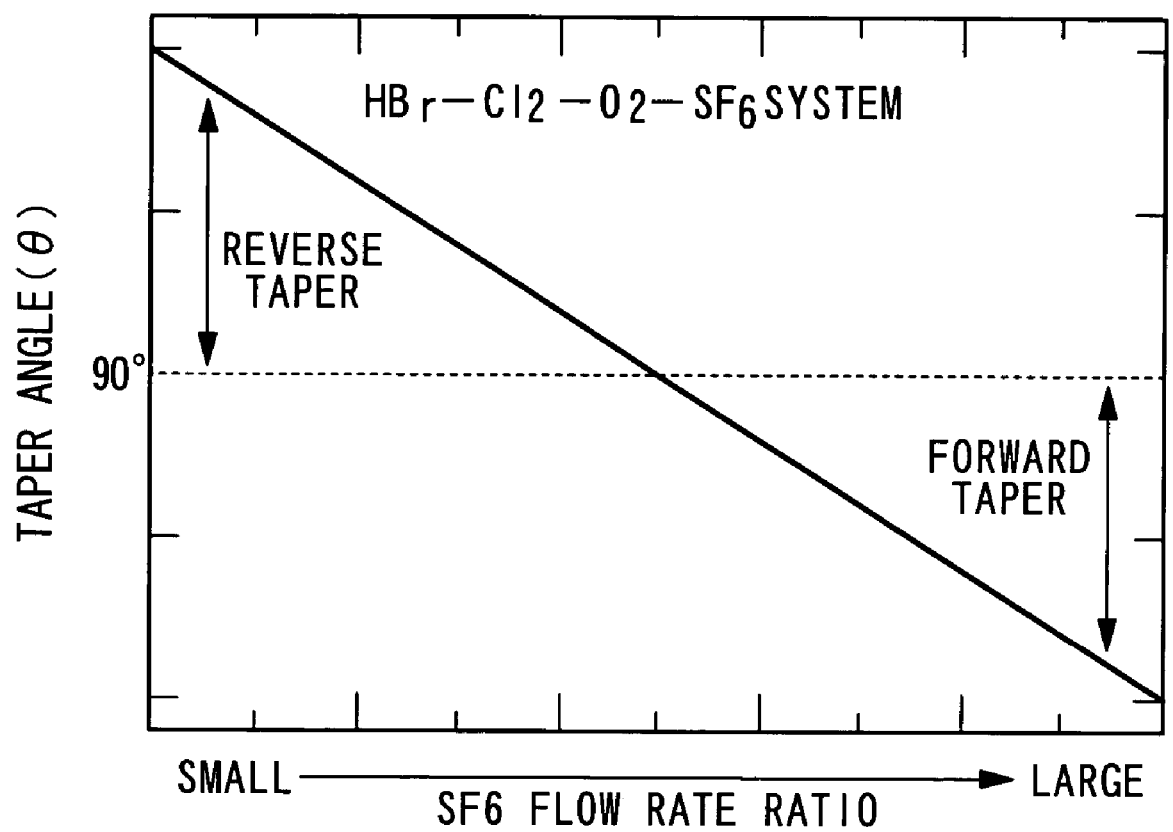
FIG. 9 is a view showing a generation condition of a normal taper and a reverse taper in etching.

Here, a method of forming the etching end plane in a reverse tapered shape or a forward tapered shape at the etching step will be described. FIG. 9 shows a relation between a tapered angle (è) and a flow rate ratio of $SF_6$ gas in the etching in $HBr$—$Cl_2$—$O_2$—$SF_6$ system mixed gas atmosphere. As shown in FIG. 9, in case of usage of this mixed gas, the forward tapered shape is obtained as the flow rate ratio of the $SF_6$ gas is increased, and the reverse tapered shape is obtained as the flow rate ratio of the $SF_6$ gas is decreased.

Figure 10A:
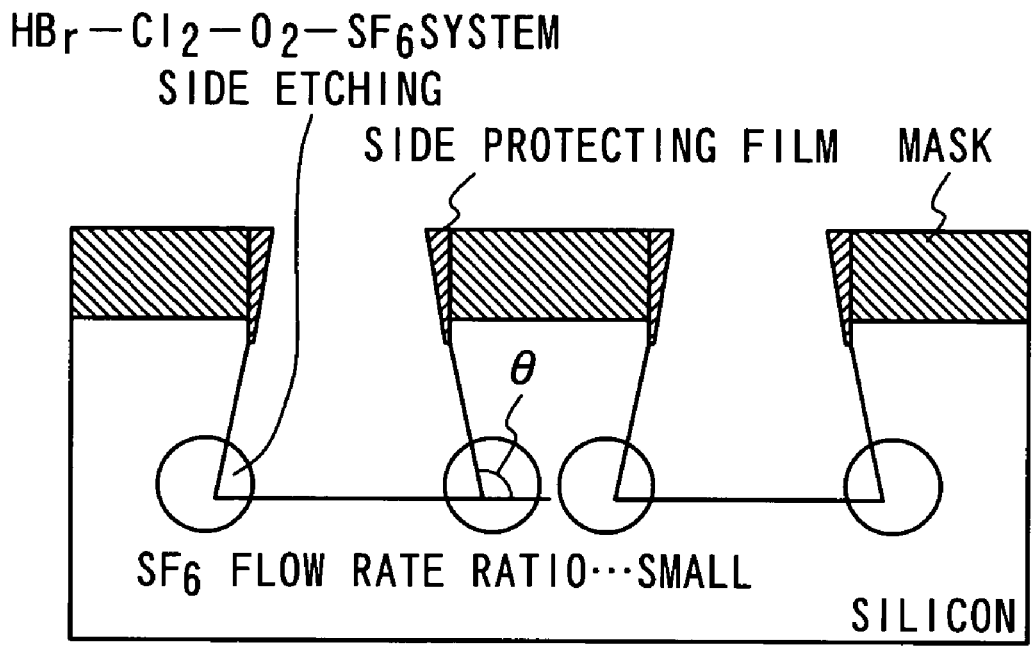
FIG. 10A is a sectional view showing a part of a generation principle of a normal taper and a reverse taper.
Figure 10B:
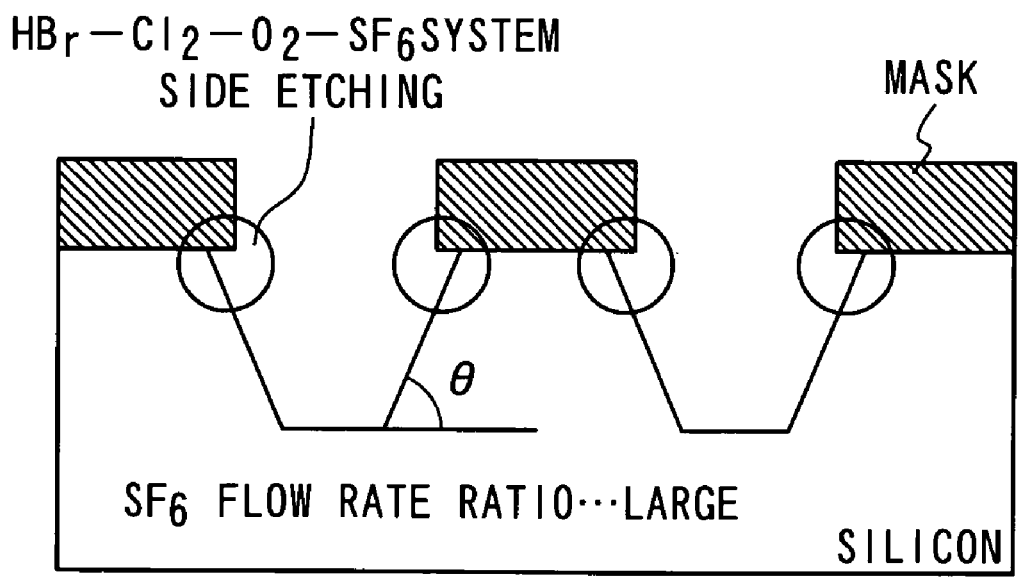
FIG. 10B is a sectional view showing another part of a generation principle of a normal taper and a reverse taper.

This reason could be considered as follows. FIGS. 10A and 10B are schematic sectional views showing the taper shape of a silicon layer when the silicon layer is etched in the $HBr$—$Cl_2$—$O_2$—$SF_6$ system mixed gas atmosphere, similarly to FIG. 9. FIG. 10A shows the shape of the formed taper when the flow rate ratio of the $SF_6$ gas is low in this mixed gas atmosphere, and FIG. 10B shows the shape of the formed taper when the flow rate ratio of the $SF_6$ gas is high.

If the flow rate ratio of the $SF_6$ gas is low (FIG. 10A), in an initial period of the etching operation, etching products are deposited to form a side protection film on a pattern end. This side protection film has a function to protect the silicon layer from the etching, and it is difficult to carry out side etching near a boundary between a mask material and the silicon layer. However, the side protection film is not formed in a lower region. Thus, the protection function against the etching by the side protection film becomes weak in the lower region portion, and the side etching is carried out in the lower region portion of the silicon layer. Thus, the reverse tapered shape is obtained as the final shape (FIG. 10A).

On the contrary, as shown in FIG. 10B, if the flow rate ratio of the $SF_6$ gas is high, the side protection film is difficult to be formed during the etching operation. Thus, there is no protection function against the etching by the side protection film, and the side etching is carried out from the initial period of the etching operation, and the lower region portion of the mask material is etched increasingly. Therefore, as the final shape, the forward tapered shape is obtained, in which the upper region portion of the silicon layer in the lower region of the mask material is strongly affected by the side etching.

It should be noted that the comparison with the case when the device isolation trenches are formed to have the forward tapered shape will be described later in [Comparison Example].

By the way, in this embodiment, both of the first polysilicon film 15 for the gate electrode and the silicon film 13 are reverse tapered in the etching for forming the device isolation trenches. However, even if only the first polysilicon film 15 is reverse tapered, the residual polysilicon film can be protected when the gate electrode portion is formed. This is because the silicon film 13 is not etched when the gate electrode portion is formed.

Also, here, the stopper nitride film 16 is vertically etched. However, even if the stopper nitride film 16 is formed to have the reverse tapered shape, there is no problem.

Figure 7D:
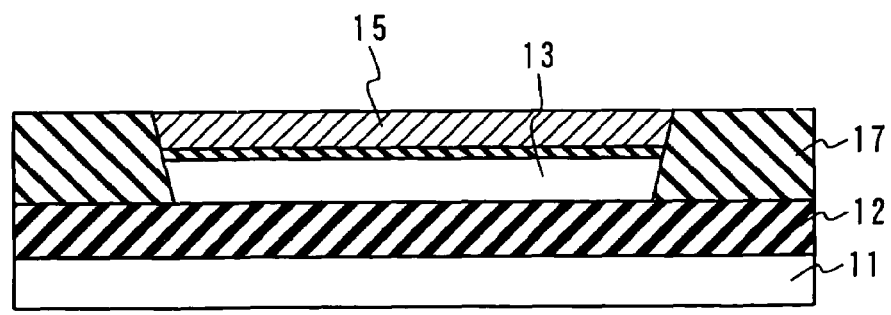
FIG. 7D is still another step order sectional view showing a manufacturing method in a first embodiment of the present invention.

Next, as shown in FIG. 7D, the stopper nitride film 16 and a part of the STI embedded insulating film 17 are removed to expose the first polysilicon film 15. At this time, in order to make the heights of the surfaces of the first polysilicon film 15 and the STI embedded insulating film 17 equal to each other, the stopper nitride film 16 and the STI embedded insulating film 17 are etched by the RIE of the same rate condition. Consequently, as shown in FIG. 7D, when the stopper nitride film 16 is removed, the heights of the first polysilicon film 15 and the STI embedded insulating film 17 are made equal to each other.

Figure 11:
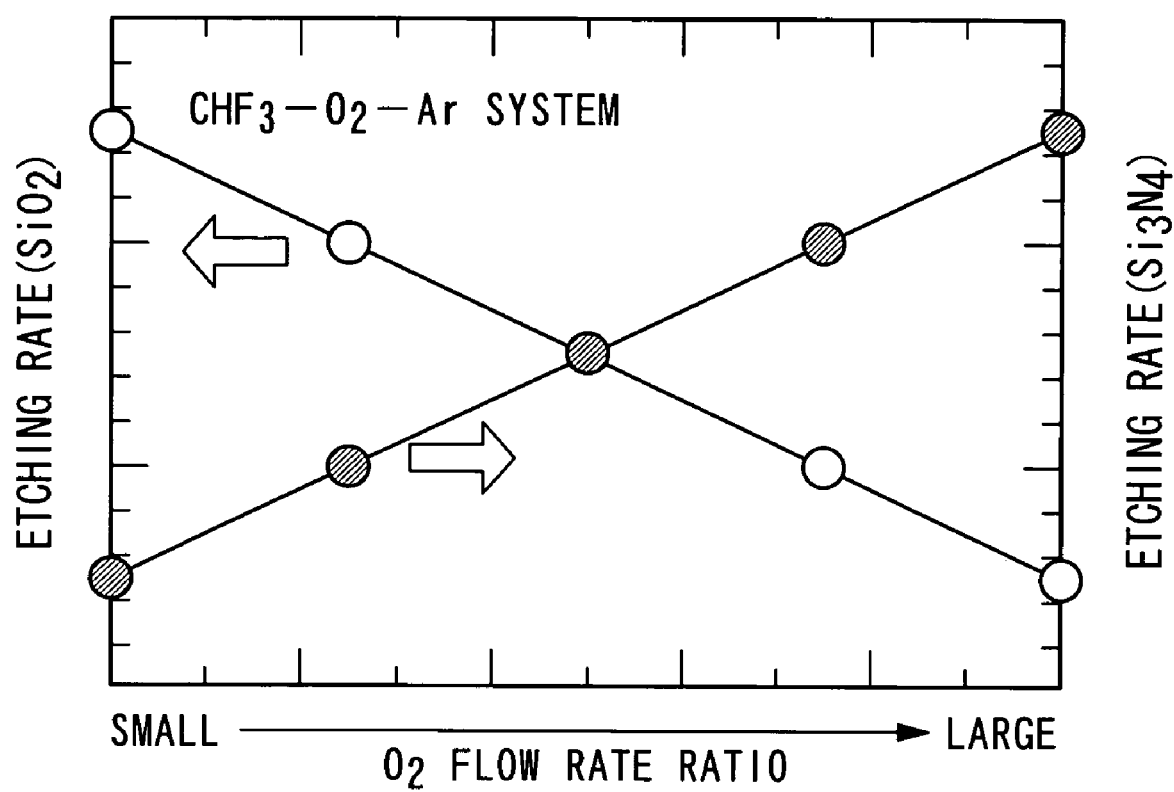
FIG. 11 is a comparison view between etching speeds of a silicon nitride film and a silicon oxide film in RIE.

The condition setting method of the same rate etching method will be described below. FIG. 11 shows a relation between a flow rate ratio of $O_2$ gas and an etching rate of $SiO_2$ (the STI embedded insulating film 17) and $Si_3N_4$ (the stopper nitride film 16). This data is obtained from the etching that uses the mixed gas of $CHF_3$—$O_2$—Ar system. From FIG. 11, it could be understood that in association with the increase in the flow rate ratio of the $O_2$ gas, the etching rate of the $SiO_2$ is made slower, and on the other hand, the etching rate of the $Si_3N_4$ is made faster, and both of the etching rates become equal to each other at a certain point.

It should be noted that the etching operation to attain the state shown in FIG. 7D is desired to be carried out under the same etching rate condition. However, even if the etching can not be carried out under the perfectly same condition, if a difference between both of the etching rates is within 20%, there is no special problem on an actual usage.

By the way, in the steps from FIG. 7C to FIG. 7D, if the stopper nitride film 16 is removed by using hot phosphoric acid, the STI embedded insulating film 17 protrudes upwardly by the thickness of the stopper nitride film 16 to generate a step. Such a step deteriorates the shape of the gate electrode at a next step of forming a gate electrode. However, this embodiment uses the same etching rate method to prevent the step from being generated between the first polysilicon film 15 and the STI embedded insulating film 17. Thus, it is possible to attain the patterning at a high accuracy.

Here, as the method of removing the step, the following method is effective besides the same etching rate method. In FIG. 7C, the upper ends of the stopper nitride film 16 and the STI embedded insulating film 17 are flattened by the CMP method. Subsequently, the STI embedded insulating film 17 is etched up to the height of the lower portion of the stopper nitride film 16 by the RIE method in which its rate is faster than that of the stopper nitride film 16 (FIG. 8D). Then, the stopper nitride film 16 is selectively removed by using the hot phosphoric acid.

Figure 8A:
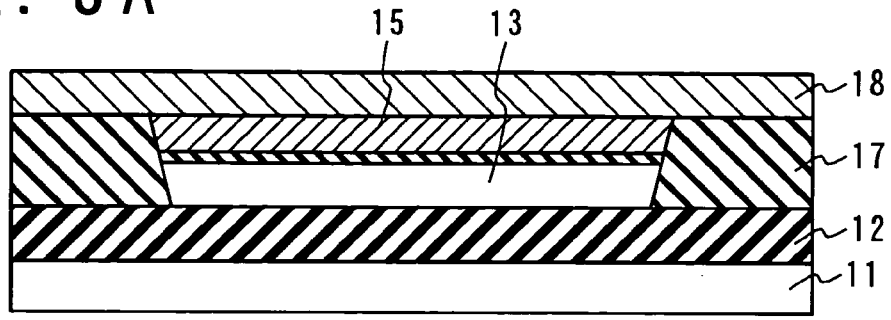
FIG. 8A is still another step order sectional view showing a manufacturing method in a first embodiment of the present invention.
Figure 8B:
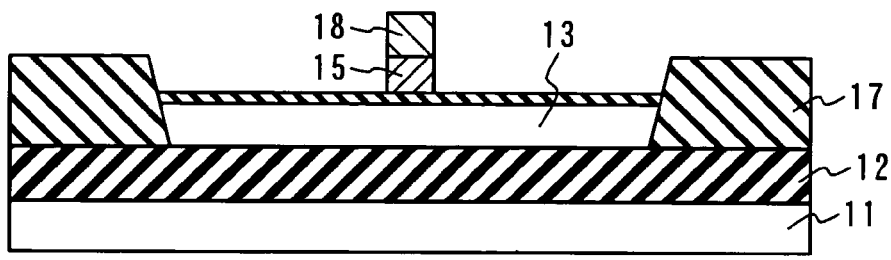
FIG. 8B is still another step order sectional view showing a manufacturing method in a first embodiment of the present invention.

Next, a second polysilicon film 18 is deposited for forming a gate wiring line to connect the gate electrodes (FIG. 8A). Subsequently, a lithography and a high density plasma etching technique are used to pattern the second and first polysilicon films to produce the lamination structure of the gate electrode and the gate wiring line composed of the first polysilicon film 15 and the second polysilicon film 18 (FIG. 8B).

Figure 8C:
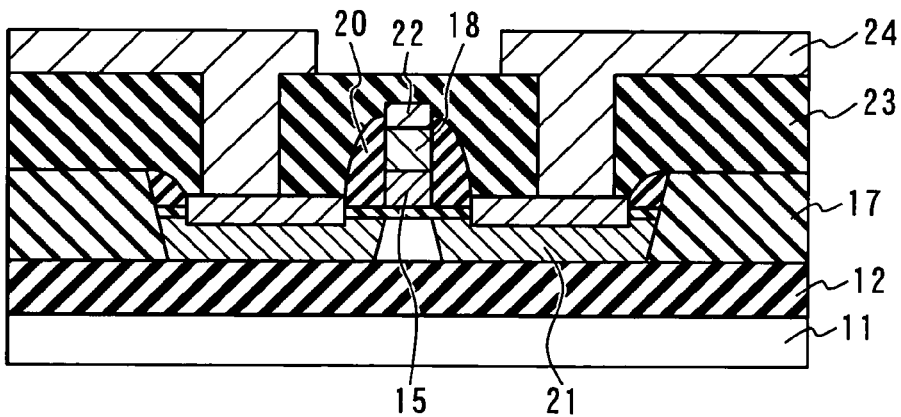
FIG. 8C is still another step order sectional view showing a manufacturing method in a first embodiment of the present invention.
Figure 8D:
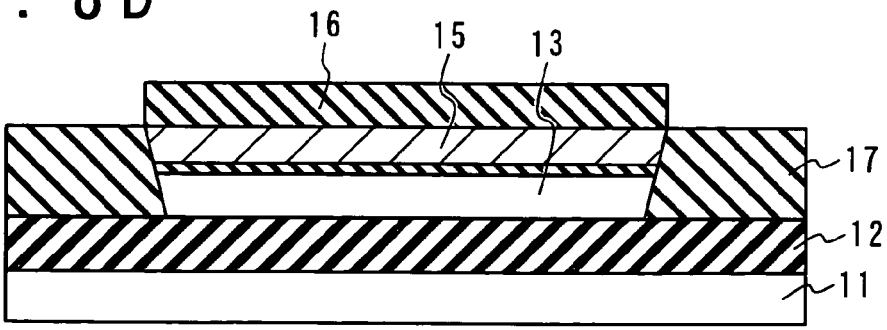
FIG. 8D is still another step order sectional view showing a manufacturing method in a first embodiment of the present invention.

Next, a chemical vapor deposition (hereafter, referred to as CVD) method is used to form as an oxide film on the entire surface to have the thickness of 80 nm. Subsequently, an anisotropic dry etching is carried out to form side wall insulating films 20 on side walls of the gate electrode. Then, an ion implantation and a heat treatment are used to form source and drain regions 21. Subsequently, a sputtering method is used to deposit a cobalt film on the entire surface and then a heat treatment is carried out to form a silicide film 22. Then, a non-silicided cobalt film is removed. After an interlayer insulating film 23 is formed thickly, contact holes are opened. The sputtering method is used to deposit a metal film of aluminum and the like, and the metal film is patterned to form a metal wiring 24 (FIG. 8C).

Figure 1A:
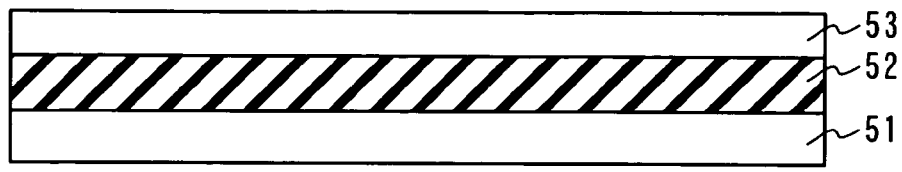
FIG. 1A is a step order sectional view showing a manufacturing method of a first conventional example in the present invention.
Figure 1B:
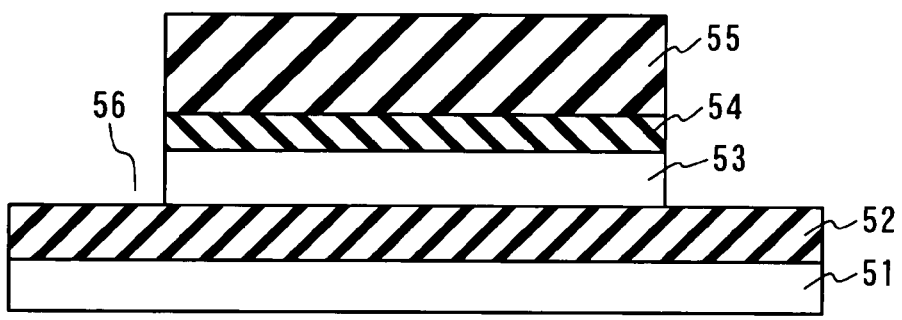
FIG. 1B is another step order sectional view showing a manufacturing method of a first conventional example in the present invention.
Figure 1C:
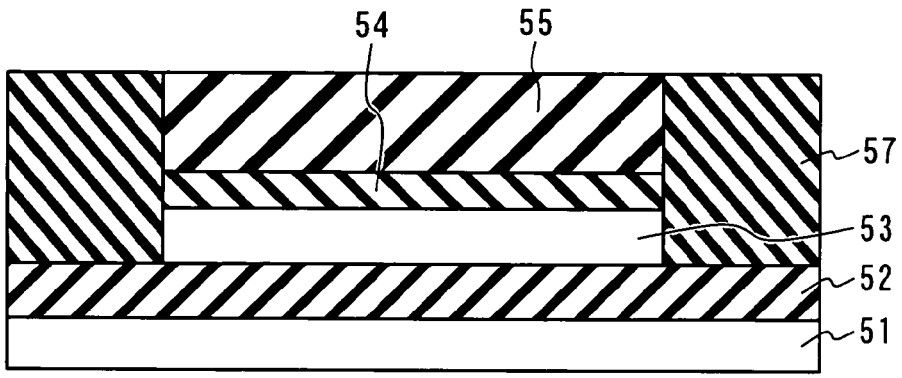
FIG. 1C is still another step order sectional view showing a manufacturing method of a first conventional example in the present invention.
Figure 1D:
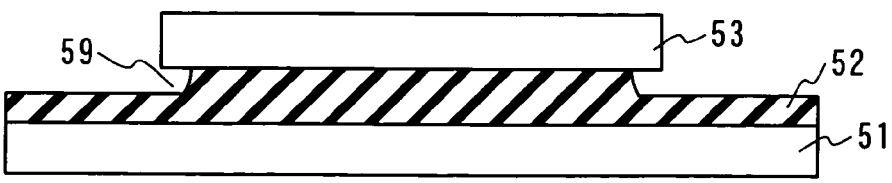
FIG. 1D is still another step order sectional view showing a manufacturing method of a first conventional example in the present invention.
Figure 2A:
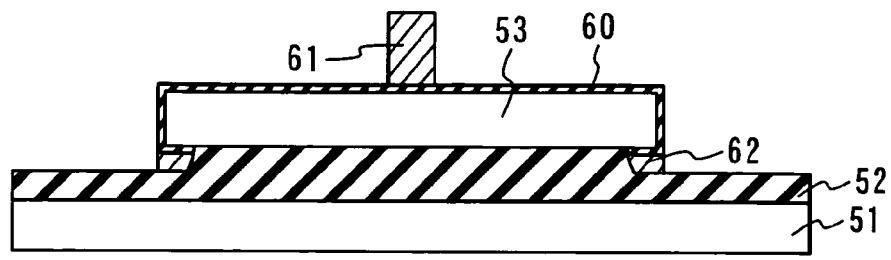
FIG. 2A is still another step order sectional view showing a manufacturing method of a first conventional example in the present invention.
Figure 2B:
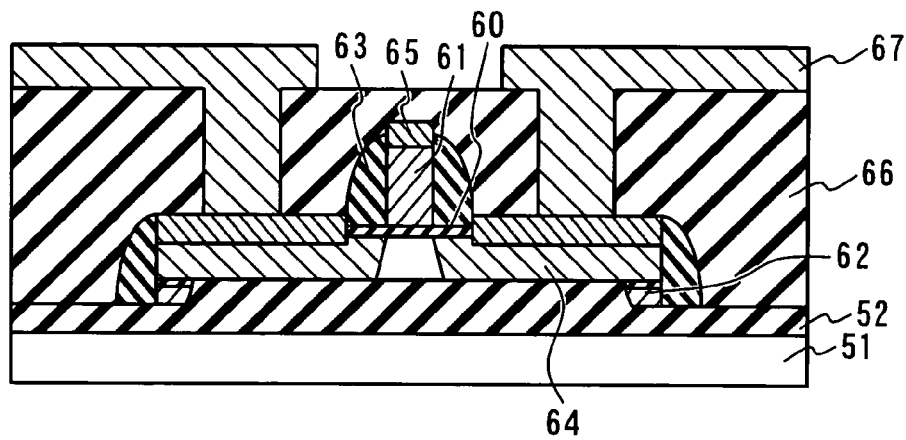
FIG. 2B is still another step order sectional view showing a manufacturing method of a first conventional example in the present invention.
Figure 2C:
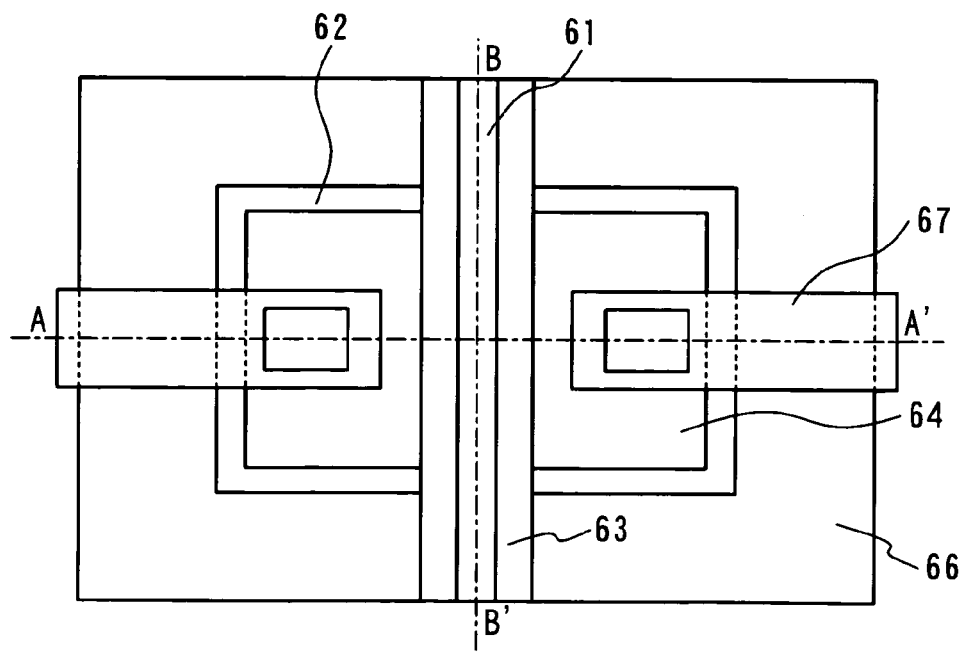
FIG. 2C is a plan view showing a manufacturing method of a first conventional example in the present invention.
Figure 3A:
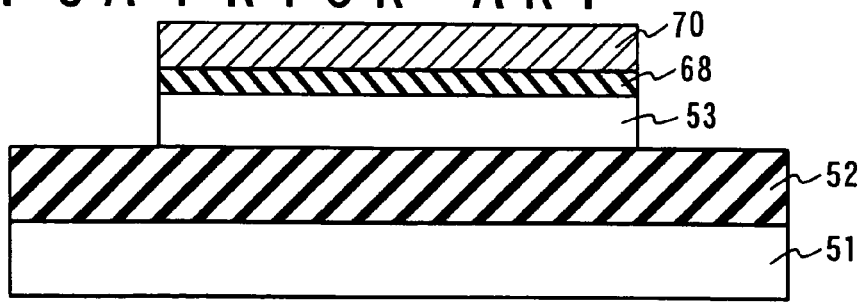
FIG. 3A is a step order sectional view showing a manufacturing method of a second conventional example in the present invention.
Figure 3B:
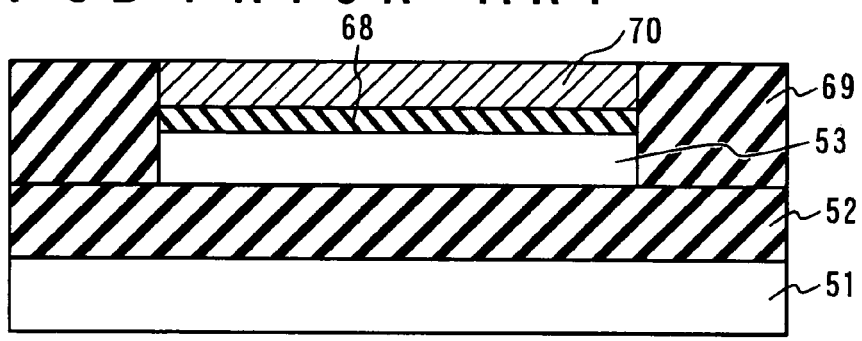
FIG. 3B is another step order sectional view showing a manufacturing method of a second conventional example in the present invention.
Figure 3C:
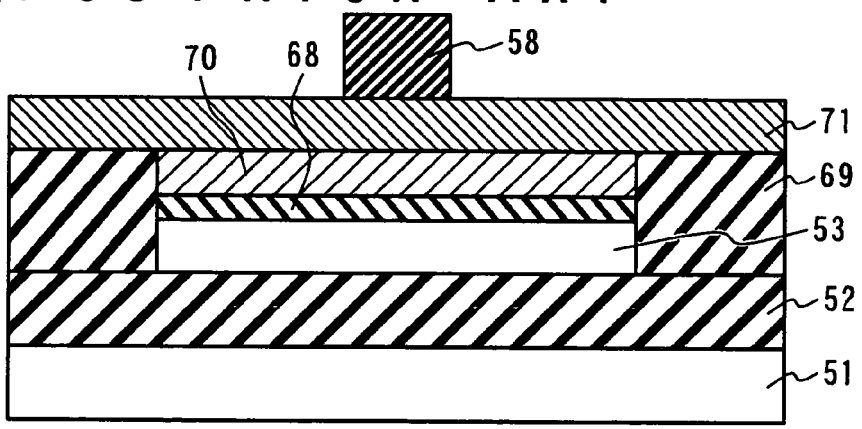
FIG. 3C is still another step order sectional view showing a manufacturing method of a second conventional example in the present invention.
Figure 3D:
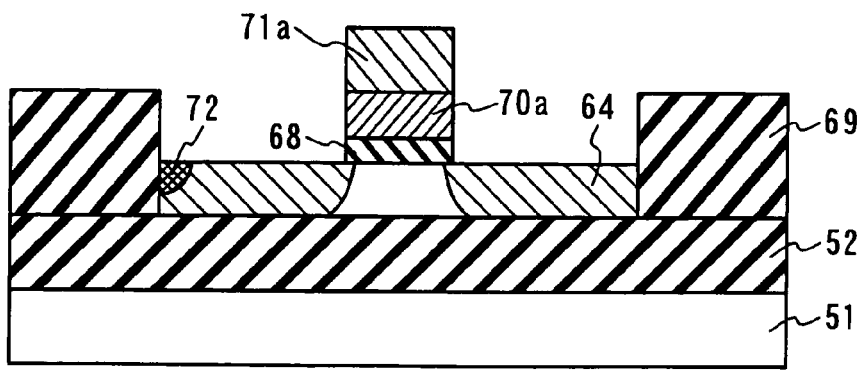
FIG. 3D is still another step order sectional view showing a manufacturing method of a second conventional example in the present invention.
Figure 4:
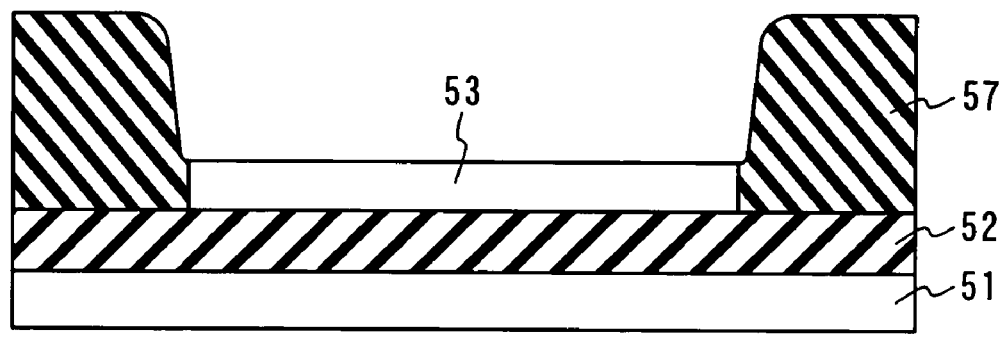
FIG. 4 is a sectional view describing a problem in the conventional examples.
Figure 5A:
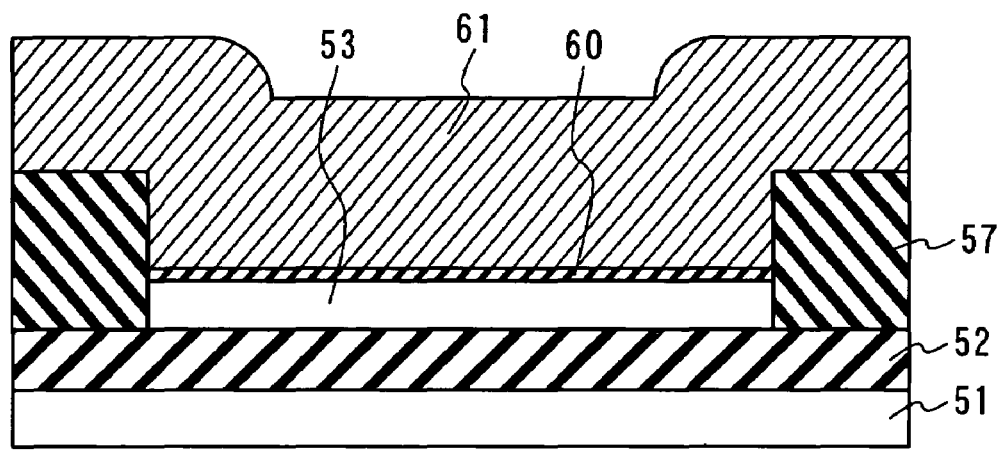
FIG. 5A is a step order sectional view describing a problem in the first conventional example.
Figure 5B:
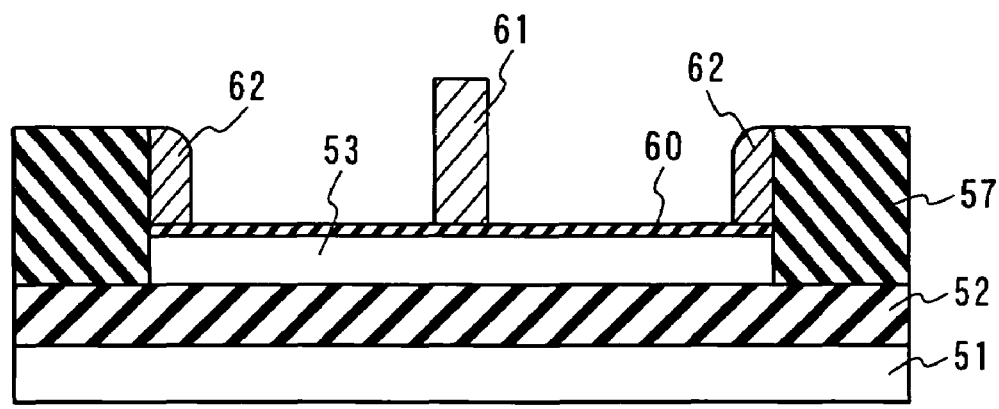
FIG. 5B is another step order sectional view describing a problem in the first conventional example.
Figure 6A:
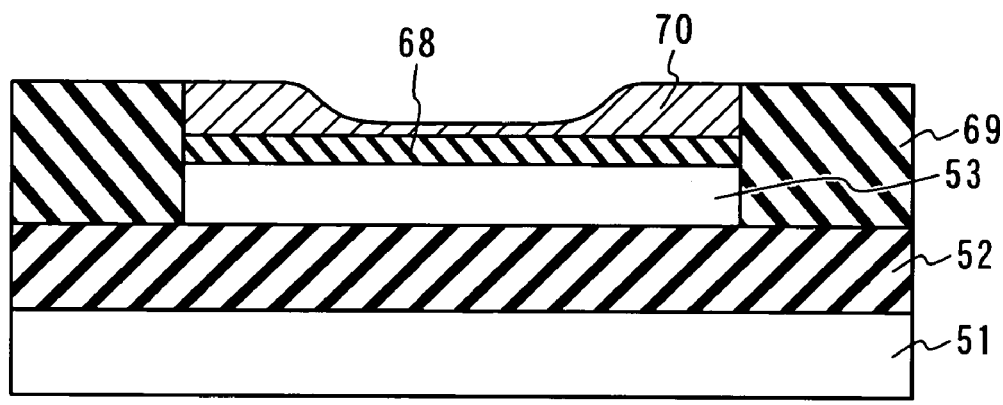
FIG. 6A is a step order sectional view describing a problem in the second conventional example.
Figure 6B:
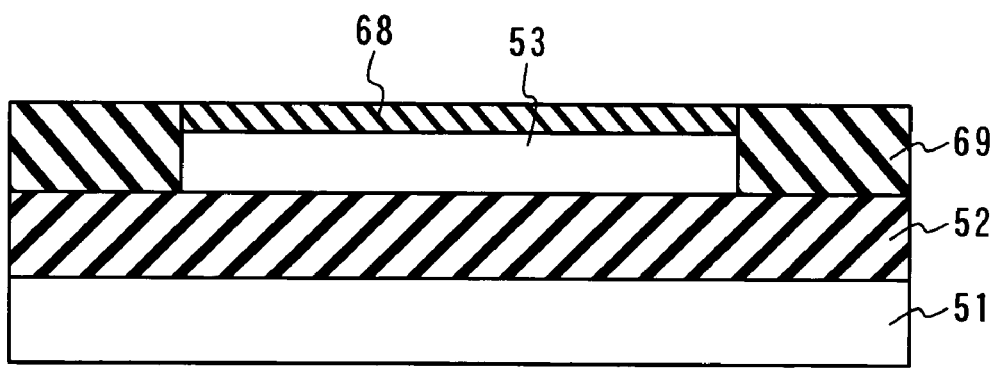
FIG. 6B is another step order sectional view describing a problem in the second conventional example.

Here, the patterning for forming the gate electrode is carried out to the structure in which the second polysilicon film 18 is flat (FIG. 8A). Also, the device isolation trench has the reverse tapered shape. Therefore, the polysilicon film is never left on the side wall of the STI embedded insulating film 17. Moreover, the electrical short circuit is never generated between the gate electrode and the source and drain regions 21. Also, since the STI embedded insulating film 17 has a protruding structure as compared with the silicon film 13, the sides of the silicon film are never covered with the gate electrode. Therefore, it is possible to suppress the reverse narrow channel effect that was the problem when the STI separation of the conventional method is used. Moreover, after the STI embedded insulating film 17 is embedded, it is not necessary to carry out the HF process in order to remove the pad oxide film (54 of FIG. 1C). Thus, unlike the case of the first conventional example, the STI embedded insulating film 17 is never reduced or lost. Thus, the over-etching of the buried oxide film 12 under the end of the silicon film never occurs, the over-etching was the problem conventionally in case of the usage of the very thin film SOI substrate. Therefore, the residual polysilicon film (a symbol 62 of FIGS. 2A, B) is never generated. Also, the electric short circuit is never generated between the gate electrodes and between the gate electrode and the source drain region.

(Second Embodiment)

FIGS. 12A to 13D are sectional views showing a manufacturing method in a second embodiment of the present invention. At first, a gate insulating film 14, a first polysilicon film 15 and a stopper nitride film 16 are deposited (FIG.

Figure 12A:
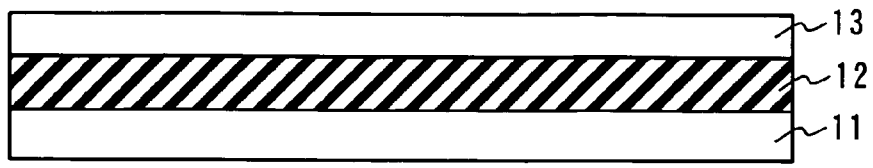
FIG. 12A is a step order sectional view showing a manufacturing method in a second embodiment of the present invention.

12B) in this order on an SOI substrate composed of a silicon substrate 11, a buried oxide film 12 and a silicon film 13 having the film thickness of 10 nm, as shown in FIG. 12A.

Figure 12B:
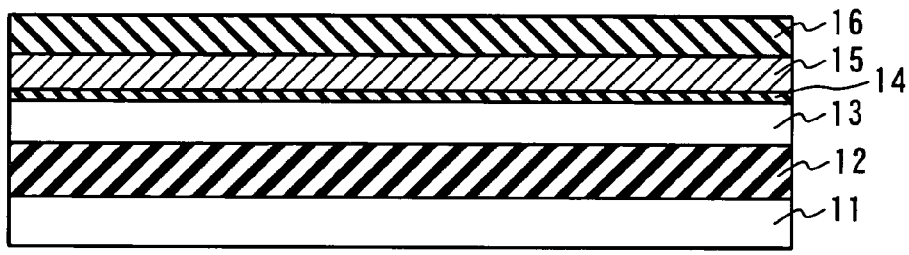
FIG. 12B is another step order sectional view showing a manufacturing method in a second embodiment of the present invention.
Figure 12C:
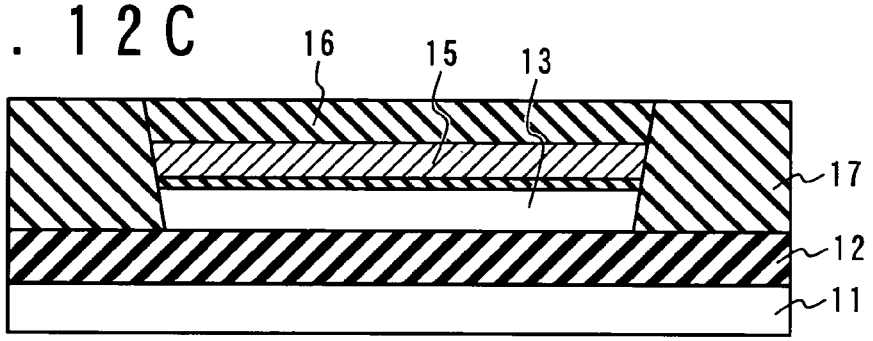
FIG. 12C is still another step order sectional view showing a manufacturing method in a second embodiment of the present invention.

Next, a stopper nitride film 16, a first polysilicon film 15, a gate insulating film 14 and a silicon film 13 are selectively etched to form device isolation trenches. At this time, the sides of the stopper nitride film 16, the first polysilicon film 15 and the silicon film 13 are etched to have the reverse tapered shapes. Subsequently, an STI embedded insulating film 17 is deposited, and the STI embedded insulating film 17 is flattened by the CMP method (FIG. 12C).

Figure 12D:
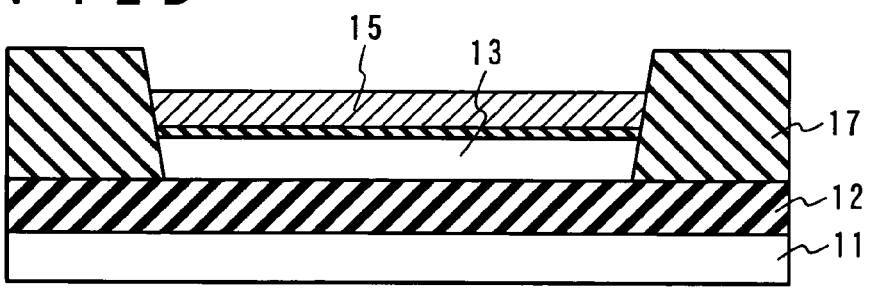
FIG. 12D is still another step order sectional view showing a manufacturing method in a second embodiment of the present invention.
Figure 12E:
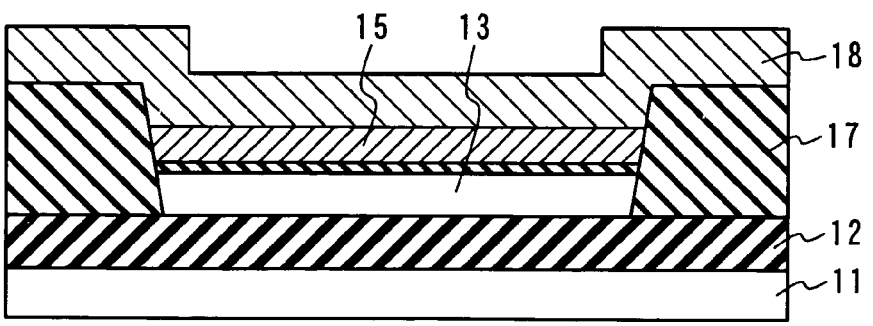
FIG. 12E is still another step order sectional view showing a manufacturing method in a second embodiment of the present invention.
Figure 13A:
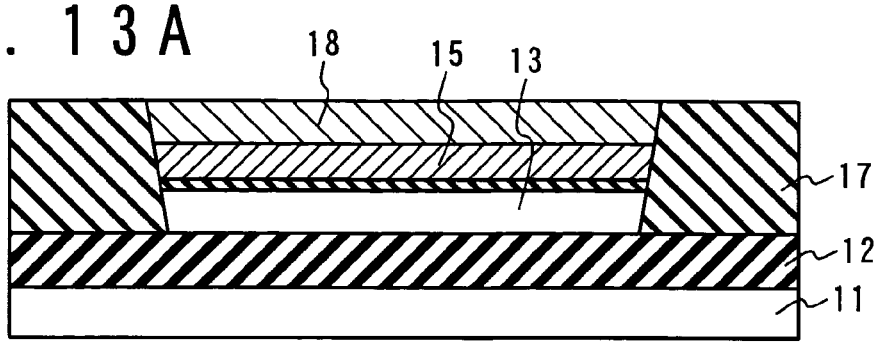
FIG. 13A is still another step order sectional view showing a manufacturing method in a second embodiment of the present invention.

Next, the hot phosphoric acid is used to remove the stopper nitride film 16 to expose the surface of the first polysilicon film 15 (FIG. 12D). Subsequently, the second polysilicon film 18 is deposited (FIG. 12E). Moreover, the CMP method is used to flatten the second polysilicon film 18 (FIG. 13A). At this CMP step, the STI embedded insulating film 17 can be used as a stopper film.

Figure 14:
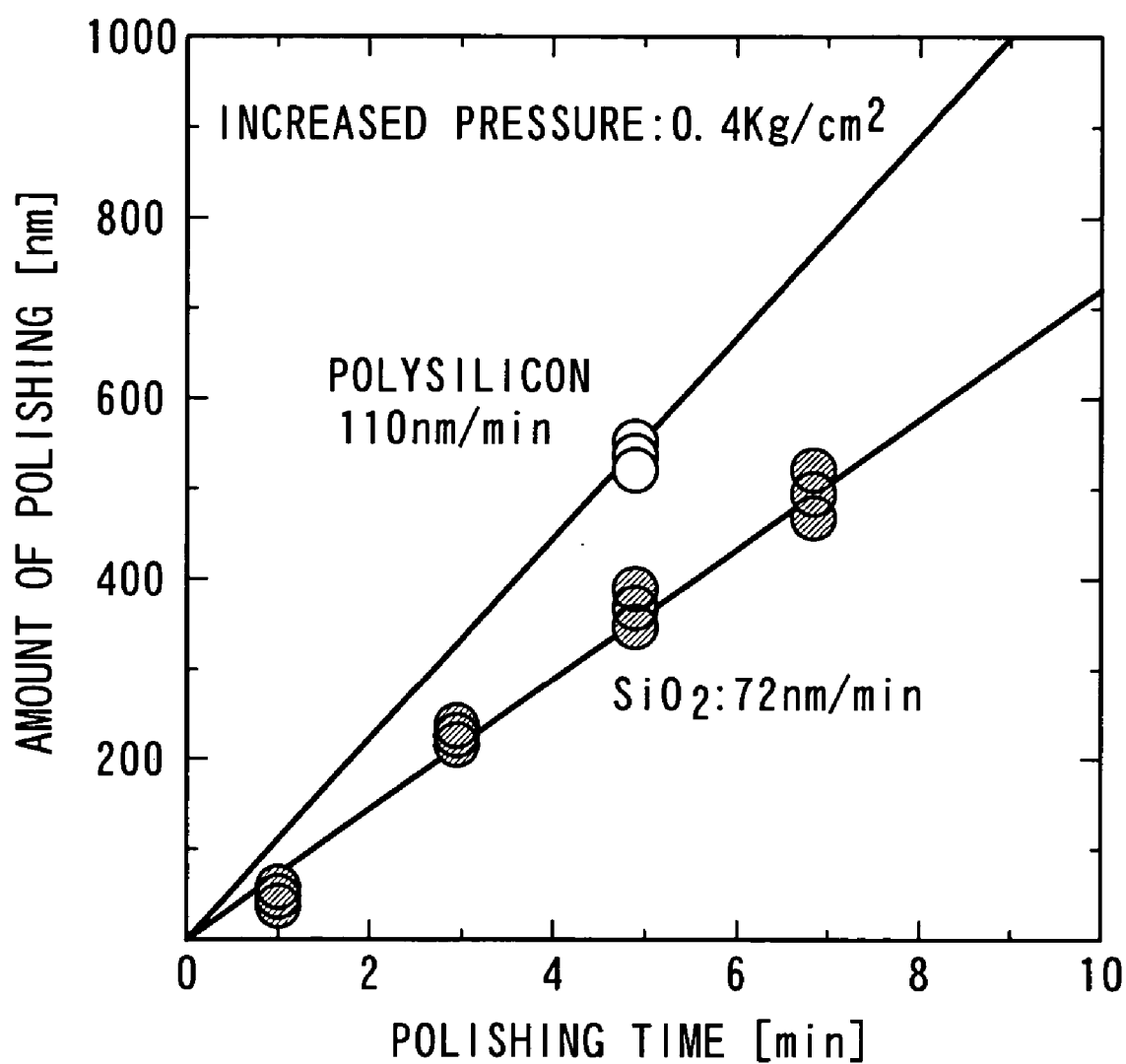
FIG. 14 is a comparison view between a polysilicon and a silicon oxide film.

Here, FIG. 14 shows the change in the polishing amount of the polysilicon film and the silicon oxide film (the STI embedded insulating film) at the CMP step. From FIG. 14, it could be understood that the polishing rate (the polishing amount per 1 min) of the polysilicon film is about 1.5 times the polishing rate of the silicon oxide film, and when the polysilicon film is polished by the CMP method, the STI embedded insulating film can be used as the stopper.

Figure 13B:
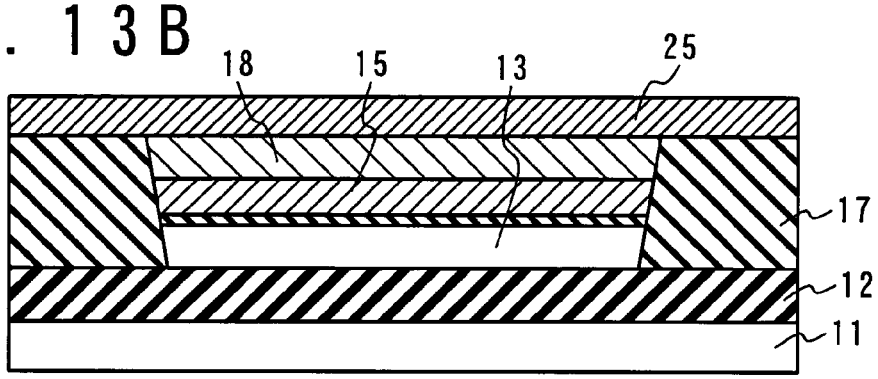
FIG. 13B is still another step order sectional view showing a manufacturing method in a second embodiment of the present invention.
Figure 13C:
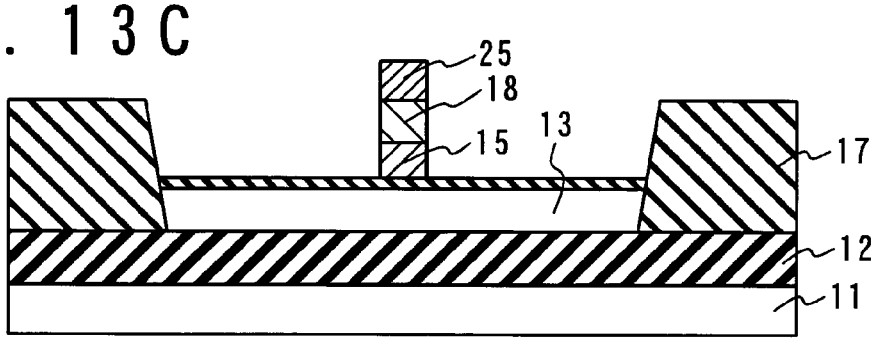
FIG. 13C is still another step order sectional view showing a manufacturing method in a second embodiment of the present invention.
Figure 13D:
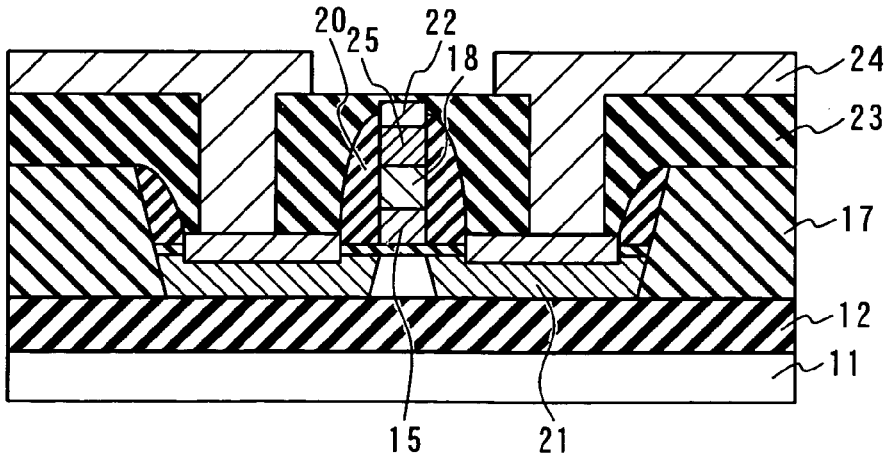
FIG. 13D is still another step order sectional view showing a manufacturing method in a second embodiment of the present invention.

Next, a third polysilicon film 25 is deposited to form a gate wiring line (FIG. 13B), and the lithography and the high density plasma etching technique are used to pattern a laminated polysilicon film and to form the gate wiring line of the third polysilicon film 25, and the gate electrode of the lamination structure of the first polysilicon film 15 and the first polysilicon film 18 (FIG. 13C). Subsequently, the method similar to the method described in the first embodiment is used to form side wall insulating films 20, source and drain regions 21 and a silicide film 22. An interlayer insulating film 23 is deposited, and a metal wiring 24 is formed to complete the MISFET (FIG. 13D).

In this embodiment, the same etching rate method is not used. While the state of the step is kept, a next step is carried out (FIG. 12D). However, after the deposition of the second polysilicon film 18, since the STI embedded insulating film 17 functions as the stopper at a time of a next CMP step, the step between the second polysilicon film 18 and the STI embedded insulating film 17 is removed (FIG. 13A). Moreover, after the third polysilicon film 25 is formed on the flat structure (FIG. 13B), the patterning is carried out to form the gate electrode. Thus, the generation of the residual polysilicon is suppressed. Therefore, it is possible to attain the effect similar to the first embodiment. That is, the electric short circuit is never generated between the gate electrode and the source and drain regions and between the gate electrodes. Also, the reverse narrow channel effect is suppressed, which was the problem when the STI separation is used in the conventional method. Also, since the HF process is not carried out, the STI embedded insulating film 17 is never reduced or lost.

(Third Embodiment)

FIGS. 15A to 16C are sectional views showing a manufacturing method in a third embodiment of the present invention. This embodiment is the method that does not give the reverse tapered shape to the first polysilicon film 15 and the silicon film 13.

Figure 15A:
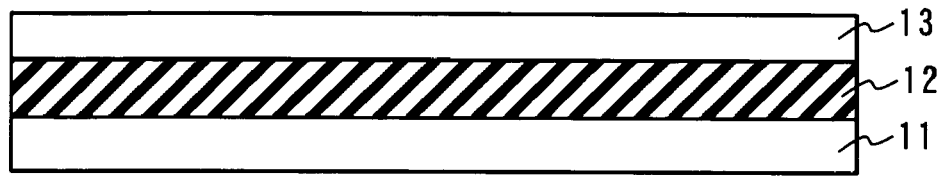
FIG. 15A is a step order sectional view showing a manufacturing method in a third embodiment of the present invention.
Figure 15B:
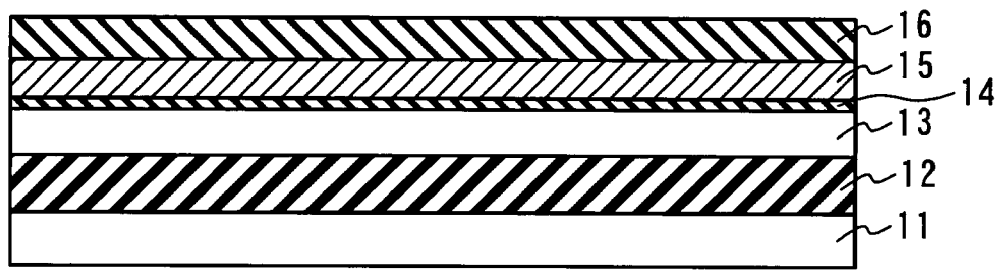
FIG. 15B is another step order sectional view showing a manufacturing method in a third embodiment of the present invention.
Figure 15C:
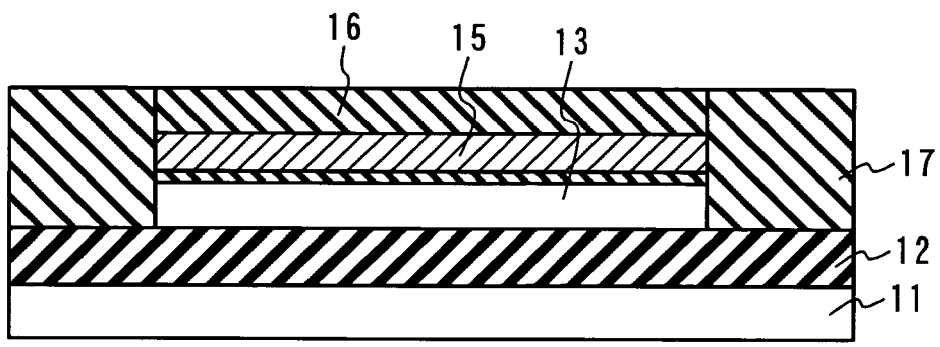
FIG. 15C is still another step order sectional view showing a manufacturing method in a third embodiment of the present invention.

As shown in FIG. 15A, a gate insulating film 14, a first polysilicon film 15 and a stopper nitride film 16 are deposited in this order on an SOI substrate having a silicon substrate 11, a buried oxide film 12 and a silicon film 13 (FIG. 15B). Subsequently, the stopper nitride film 16, the first polysilicon film 15, the gate insulating film 14 and the silicon film 13 are selectively etched to form device isolation trenches such that the side plane of the device isolation trench is vertical. Then, an STI embedded insulating film 17 is deposited, and is flattened by the CMP method (FIG. 15C).

Figure 15D:
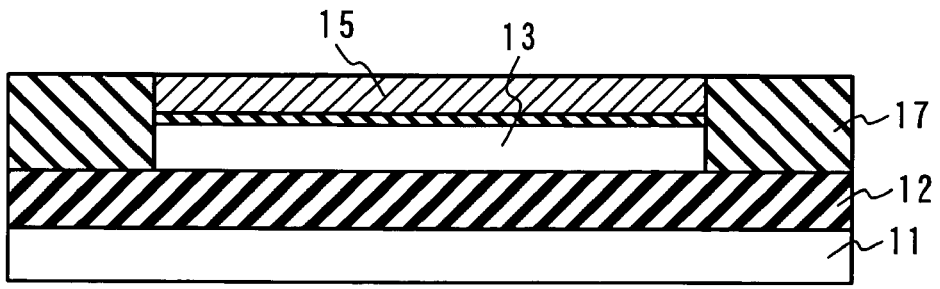
FIG. 15D is still another step order sectional view showing a manufacturing method in a third embodiment of the present invention.
Figure 16A:
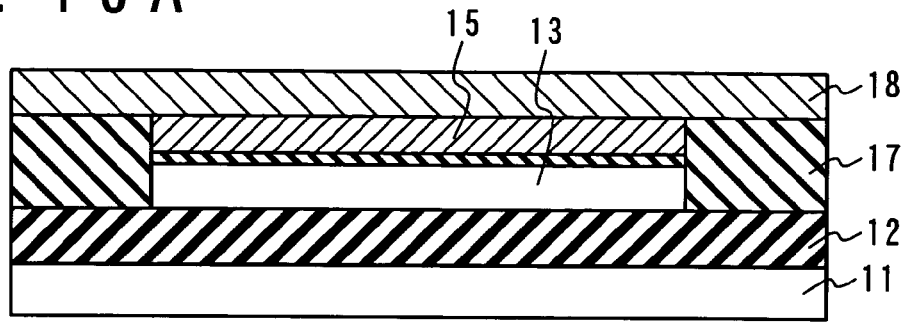
FIG. 16A is still another step order sectional view showing a manufacturing method in a third embodiment of the present invention.
Figure 16B:
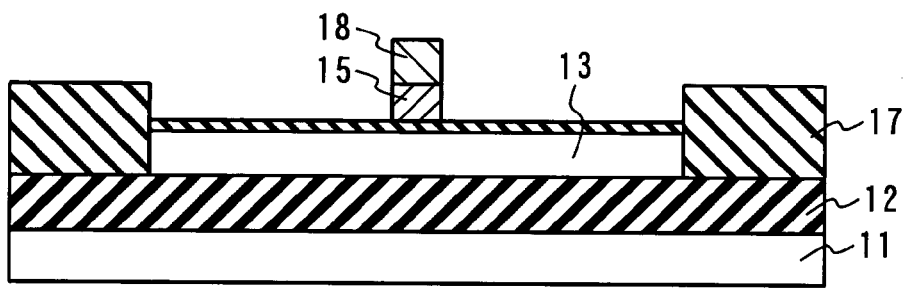
FIG. 16B is still another step order sectional view showing a manufacturing method in a third embodiment of the present invention.
Figure 16C:
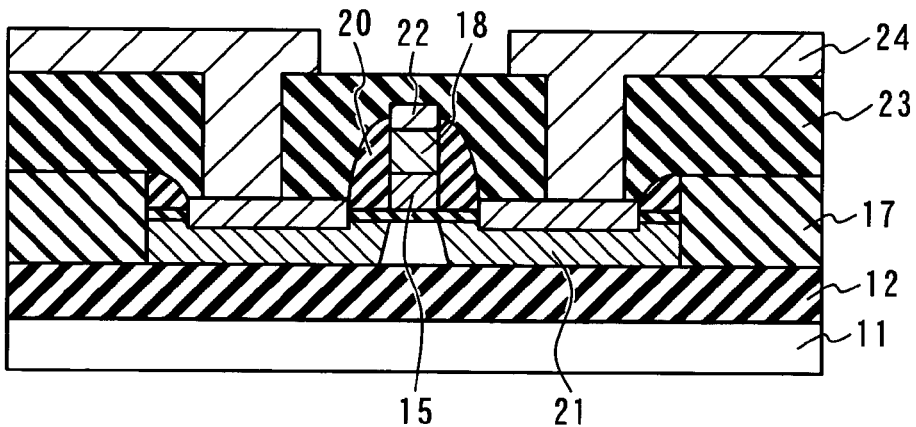
FIG. 16C is still another step order sectional view showing a manufacturing method in a third embodiment of the present invention.
Figure 16D:
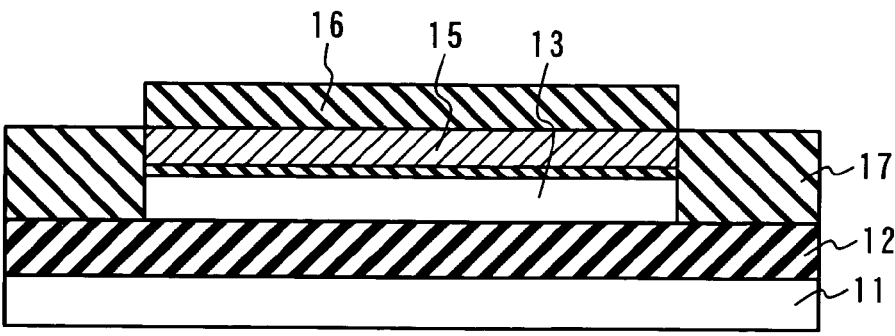
FIG. 16D is still another step order sectional view showing a manufacturing method in a third embodiment of the present invention.

Next, when the stopper nitride film 16 is removed by using the same etching rate method, a top surface of the first polysilicon film 15 and a top surface of the STI embedded insulating film 17 are etched to be substantially equal in height to each other (FIG. 15D). Also, instead of this method, the STI embedded insulating film 17 may be first etched to the stopper nitride film 16 (FIG. 16D), and then the stopper nitride film 16 may be removed through the hot phosphoric acid. Hereafter, the process is advanced in accordance with the method similar to the first embodiment (FIGS. 16A, 16B), and the MISFET is completed (FIG. 16C).

In this method, the residual property of the polysilicon film at the time of the formation of the gate electrode may be considered to be wrong as compared with the first embodiment, because a taper angle è with the first polysilicon film 15 has the shape of a right angle. However, this embodiment suppresses the occurrence of the residual polysilicon by flattening the first polysilicon film 15 and the STI embedded insulating film 17 by using the same etching rate method, or by etching the STI embedded insulating film 17 up to the lower end of the stopper nitride film 16 and removing it (FIG. 16D) and then removing the stopper nitride film 16 and flattening.

(Fourth Embodiment)

Figure 17A:
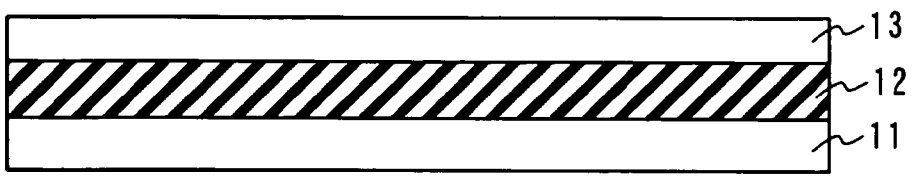
FIG. 17A is a step order sectional view showing a manufacturing method in a fourth embodiment of the present invention.
Figure 17B:
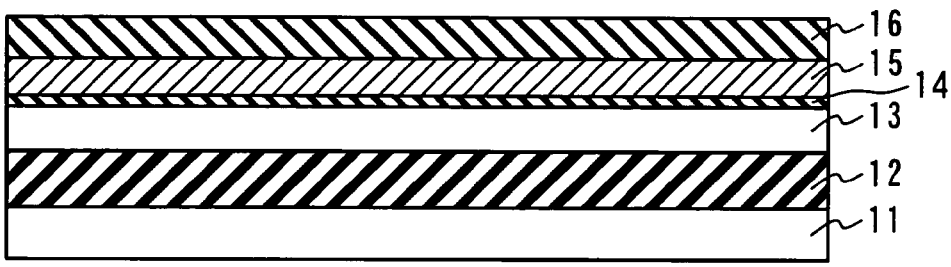
FIG. 17B is another step order sectional view showing a manufacturing method in a fourth embodiment of the present invention.
Figure 17C:
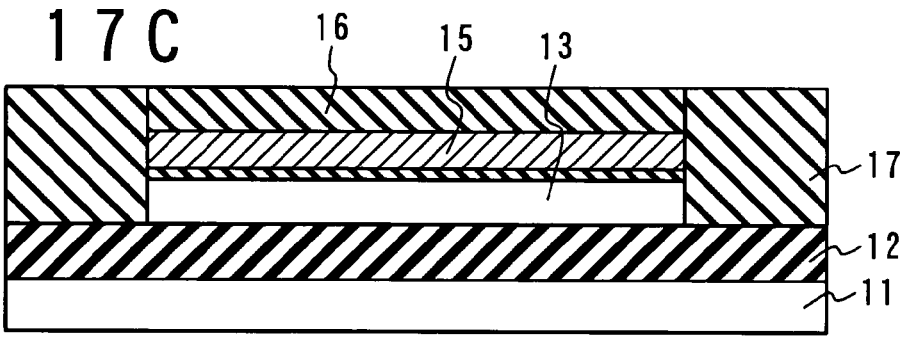
FIG. 17C is still another step order sectional view showing a manufacturing method in a fourth embodiment of the present invention.

FIGS. 17A to 18D are sectional views showing a manufacturing method in a fourth embodiment of the present invention. As shown in FIG. 17A, a gate insulating film 14, a first polysilicon film 15 and a stopper nitride film 16 are deposited in this order on an SOI substrate having a silicon substrate 11, a buried oxide film 12 and a silicon film 13 (FIG. 17B). Subsequently, the stopper nitride film 16, the first polysilicon film 15, the gate insulating film 14 and the silicon film 13 are selectively etched to form device isolation trenches whose sides are vertical. Then, an STI embedded insulating film 17 is deposited, and is flattened by the CMP method (FIG. 17C).

Figure 17D:
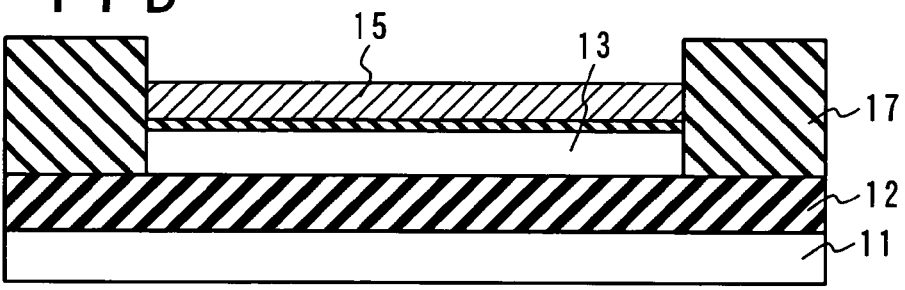
FIG. 17D is still another step order sectional view showing a manufacturing method in a fourth embodiment of the present invention.
Figure 17E:
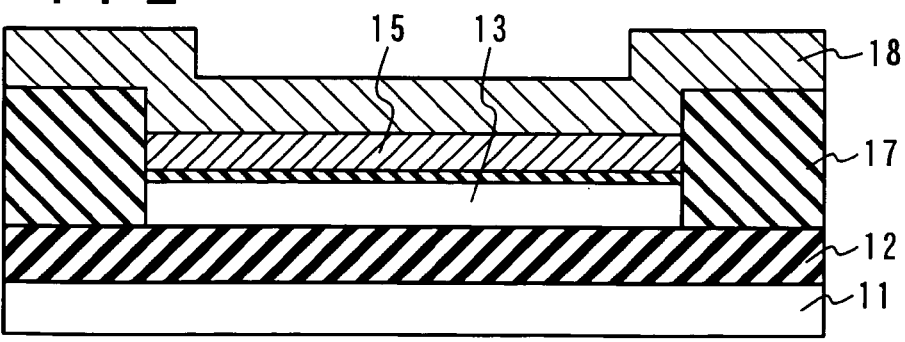
FIG. 17E is still another step order sectional view showing a manufacturing method in a fourth embodiment of the present invention.

Next, the hot phosphoric acid is used to remove the stopper nitride film 16 to expose the surface of the first polysilicon film 15 (FIG. 17D).

Figure 18A:
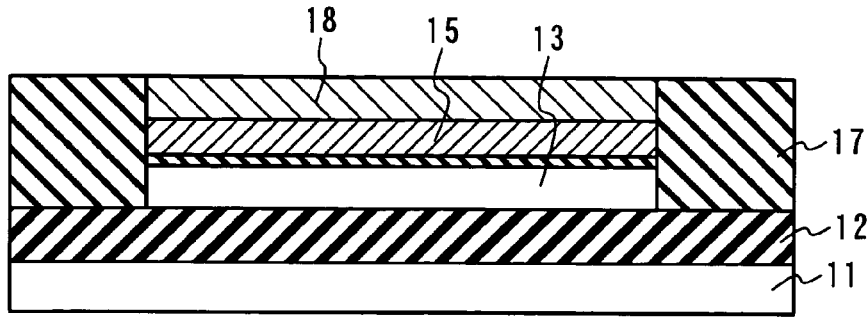
FIG. 18A is still another step order sectional view showing a manufacturing method in a fourth embodiment of the present invention.
Figure 18B:
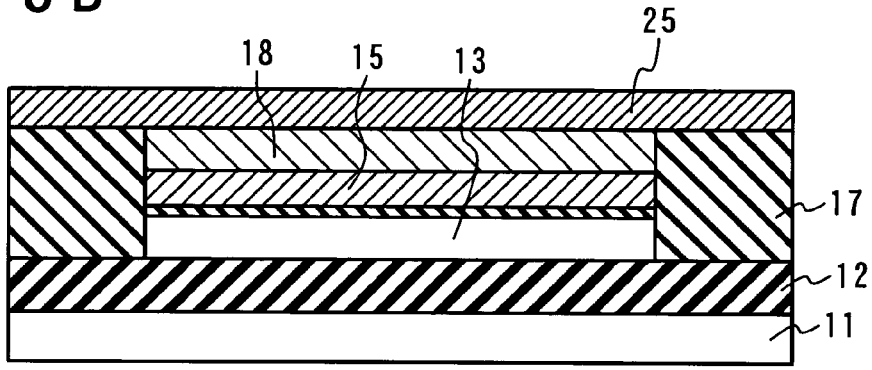
FIG. 18B is still another step order sectional view showing a manufacturing method in a fourth embodiment of the present invention.

Next, a second polysilicon film 18 is deposited (FIG. 17E), and the CMP method is used to flatten the second polysilicon film 18 (FIG. 18A). In this CMP step, the STI embedded insulating film 17 can be used as a stopper film.

Figure 18C:
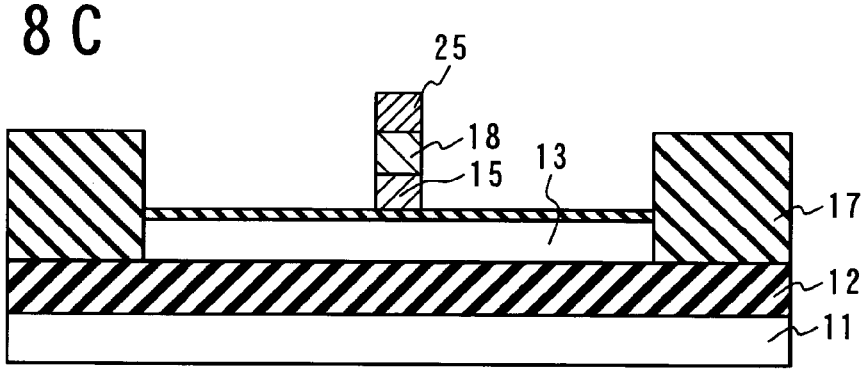
FIG. 18C is still another step order sectional view showing a manufacturing method in a fourth embodiment of the present invention.
Figure 18D:
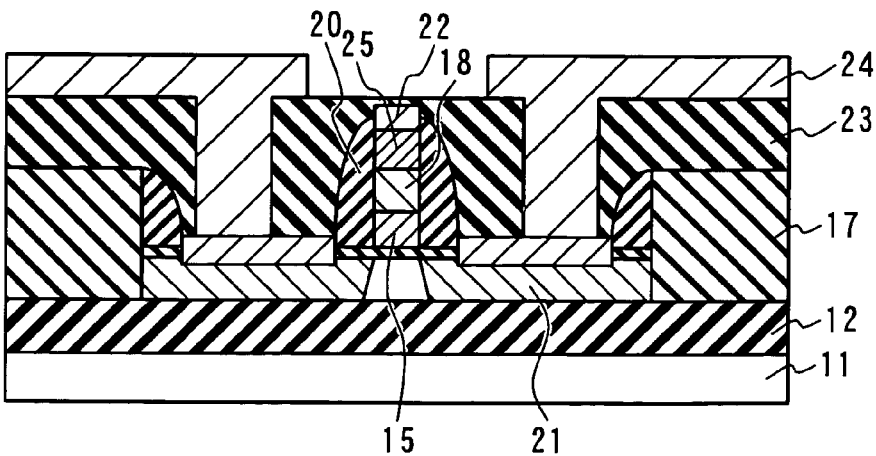
FIG. 18D is still another step order sectional view showing a manufacturing method in a fourth embodiment of the present invention.

Next, a third polysilicon film 25 for a gate wiring line is deposited (FIG. 18B), and the lithography and the high density plasma etching technique are used to pattern a laminated polysilicon film. Thus, the gate wiring line of the third polysilicon film 25, and the gate electrode of the lamination structure of the first polysilicon film 15 and the second polysilicon film 18 are formed (FIG. 18C). After that, the method similar to the method noted in the first embodiment is used to form side wall insulating films 20, source and drain regions 21 and a silicide film 22. An interlayer insulating film 23 is deposited, contact holes are opened, a metal wiring 24 is formed, and the MISFET is completed (FIG. 13D).

In this method, after the deposition of the second polysilicon film 18, the STI embedded insulating film 17 is used as the stopper, and the CMP is carried out, and the flattening operation is carried out. Thus, it is possible to attain the effect similar to that described in the second embodiment.

An actual example will be described below.

The example based on the first embodiment of the present invention will be described below with reference to FIGS. 7A to 7D and 8A to 8D. At first, the SOI substrate is prepared which is composed of the silicon substrate 11, the buried oxide film 12 having the film thickness of 50 nm to 100 nm and the silicon film 13 having the thickness of 10 nm (FIG. 7A). Subsequently, after the gate insulating film 14 is formed to have the thickness of 1.5 nm, the first polysilicon film 15 and the stopper nitride film 16 are sequentially deposited to have the thickness of 50 nm and the thickness of 50 nm, respectively (FIG. 7B).

Next, after a photolithography is used to form a resist film, this is used as a mask, and the stopper nitride film 16 is etched such that the etched side is vertical. Subsequently, the first polysilicon film 15, the gate insulating film 14 and the silicon film 13 are sequentially etched so as to be reverse tapered to form the device isolation trenches.

Next, the STI embedded insulating film 17 is deposited which is composed of a high density plasma oxide film having the thickness of 300 nm, and the CMP method is used to flatten the STI embedded insulating film 17 (FIG. 7C). Here, in a CMP method using a high purity of colloidal silica slurry, the polishing rate of the high density plasma oxide film is equal to or greater than five times of the polishing rate of the nitride film. Thus, in the CMP polishing of the STI embedded insulating film 17, the stopper nitride film 16 sufficiently functions as the stopper film even if the film thickness is 50 nm.

Next, the stopper nitride film 16 and the STI embedded insulating film 17 are etched by the RIE of the same etching rate condition to expose the first polysilicon film 15.

Next, in order to form a gate wiring line, the second polysilicon film 18 is deposited to have the thickness of 100 nm (FIG. 8A). Subsequently, the lithography and the high density plasma etching are used to pattern the laminated polysilicon film. Thus, the lamination structure of the gate wiring line is formed which is composed of the second polysilicon film 18 and the gate electrode composed of the first polysilicon film 15 (FIG. 8B).

Next, the CVD method is used to deposit the silicon oxide film on the entire surface to have the thickness of 80 nm. Then, the anisotropic etching is carried out to form the side wall insulating films 20. Then, the ion implantation and the heat treatment are used to form the source and drain regions 21. At this time, as the formation condition of the source and drain regions, a source/drain layer in an nMISFET region is formed, for example, by carrying out an ion implantation of As$^+$ under a condition of Energy: 8 keV, Dose: $4\times10^{15}$ ions/cm$^{-2}$, and a source/drain layer in a pMISFET region is formed, for example, by carrying out an ion implantation of B$^+$ under a condition of Energy: 2 keV, Dose: $5\times10^{15}$ ions/cm$^{-2}$. Moreover, an activating process (heat process) is carried out for 10 seconds at 1010° C.

Thereafter, the silicide film 22 of CoSi$_2$ is formed to have the thickness of 5 nm. Subsequently, the interlayer insulating film 23 is formed to have the thickness of 500 nm. After the contact holes are opened, the metal wiring 24 is formed. Consequently, the MISFET is completed (FIG. 8C).

SECOND EXAMPLE

Another example for a second implementation of the present invention will be described below with reference to step order sectional views of FIGS. 12, 13.

At first, as shown in FIG. 12A, an SOI substrate is prepared which is composed of a silicon substrate 11, a buried oxide film 12 having the thickness of 50 nm to 100 nm and the silicon film 13 having the thickness of 10 nm. Subsequently, a gate insulating film 14 is formed to have the thickness of 1.5 nm, and a first polysilicon film 15 and a stopper nitride film 16 are sequentially deposited to have the thickness of 50 nm and the thickness of 50 nm, respectively (FIG. 12B).

Next, the photolithography is used to form a resist film, and by using this as a mask, the stopper nitride film 16, the first polysilicon film 15, the gate insulating film 14 and the silicon film 13 are sequentially etched to be reverse tapered to form the device isolation trenches. Subsequently, an STI embedded insulating film 17 is deposited which is composed of a high density plasma oxide film having the thickness of 300 nm, and the CMP method is used to flatten the STI embedded insulating film 17 (FIG. 12C).

Next, the hot phosphoric acid is used to remove the stopper nitride film 16 to expose the first polysilicon film 15 (FIG. 12D). Subsequently, a second polysilicon film 18 is deposited to have the thickness of 100 nm (FIG. 12E). After that, the CMP method is used to flatten the second polysilicon film 18 (FIG. 13A). Here, the STI embedded insulating film 17 functions as the stopper when the second polysilicon film 18 is flattened.

Next, as shown in FIG. 13B, a third polysilicon film 25 is deposited to have the thickness of 100 nm to form a gate wiring line. Subsequently, the lithography and the high density plasma etching technique are used to pattern the laminated polysilicon film. Thus, the gate wiring line is formed which is composed of the third polysilicon film 25 and the gate electrode is formed which is composed of the lamination structure of the second polysilicon film 18 and the first polysilicon film 15 (FIG. 13C).

Next, the CVD method is used to deposit the silicon oxide film on the entire surface to have the thickness of 80 nm. Then, the anisotropic etching is carried out to form side wall insulating films 20. After that, the ion implantation and the heat treatment are used to form source and drain regions 21. As the formation condition of the source drain region at this time, the source/drain layer in an nMISFET region is formed, for example, by carrying out the ion implantation of As$^+$ under the condition of Energy: 8 keV, Dose: $4\times10^{15}$ ions/cm$^{-2}$, and the source/drain layer in a pMISFET region is formed, for example, by carrying out the ion implantation of B$^+$ under the condition of Energy: 2 keV, Dose: $5\times10^{15}$ ions/cm$^{-2}$. Moreover, the activating process (heat process) is done for 10 seconds at 1010° C.

Next, a silicide film 22 of CoSi$_2$ is formed to have the thickness of 5 nm. Subsequently, an interlayer insulating film 23 is formed to have the thickness of 500 nm. After contact holes are opened, a metal wiring 24 is formed. Then, the MISFET is completed (FIG. 8C).

COMPARISON EXAMPLE

Here, with regard to the first embodiment, an example when the etched shapes of the first polysilicon film 15, the gate insulating film 14 and the silicon film 13 are processed so as to be forward tapered will be described as a comparison example with reference to FIGS. 19A to 20C.

Figure 19A:
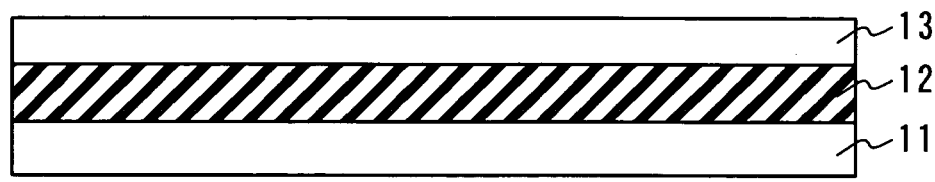
FIG. 19A is a step order sectional view showing a manufacturing method of a comparison example in the present invention.
Figure 19B:
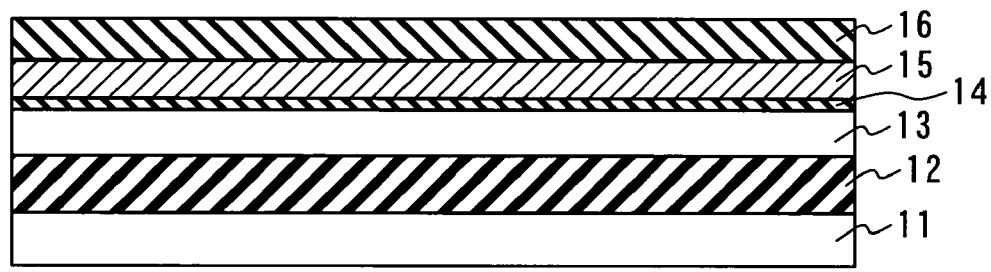
FIG. 19B is another step order sectional view showing a manufacturing method of a comparison example in the present invention.

Similarly to the first embodiment, the SOI substrate is prepared which is composed of the silicon substrate 11, the buried oxide film 12 and the silicon film 13 (FIG. 19A). The gate insulating film 14, the first polysilicon film 15 and the stopper nitride film 16 are sequentially deposited thereon (FIG. 19B).

Figure 19C:
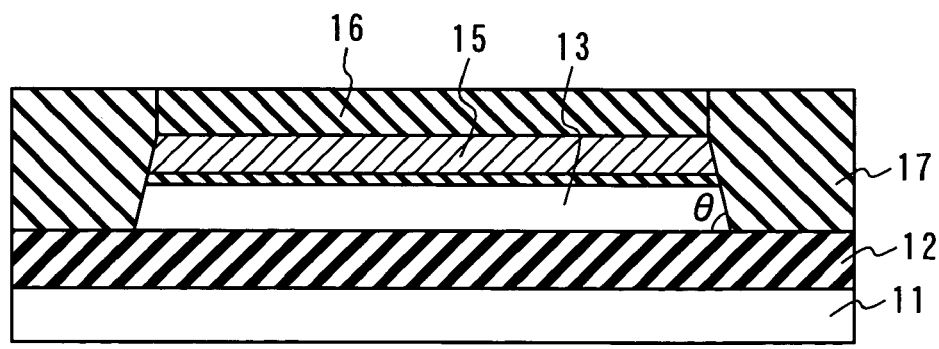
FIG. 19C is still another step order sectional view showing a manufacturing method of a comparison example in the present invention.
Figure 20A:
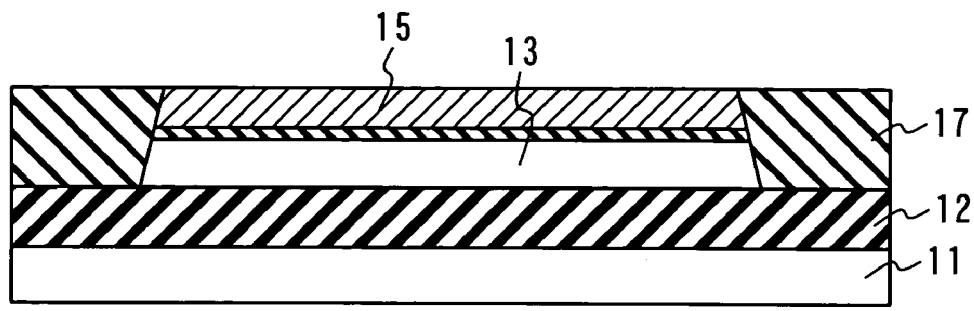
FIG. 20A is still another step order sectional view showing a manufacturing method of a comparison example in the present invention.
Figure 20B:
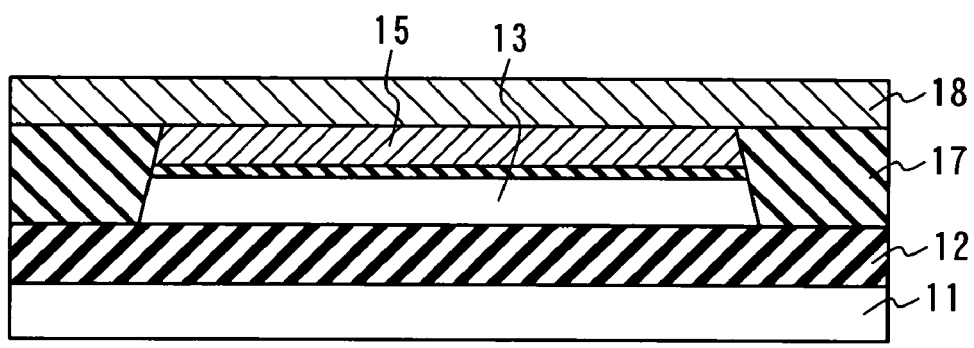
FIG. 20B is still another step order sectional view showing a manufacturing method of a comparison example in the present invention.
Figure 20C:
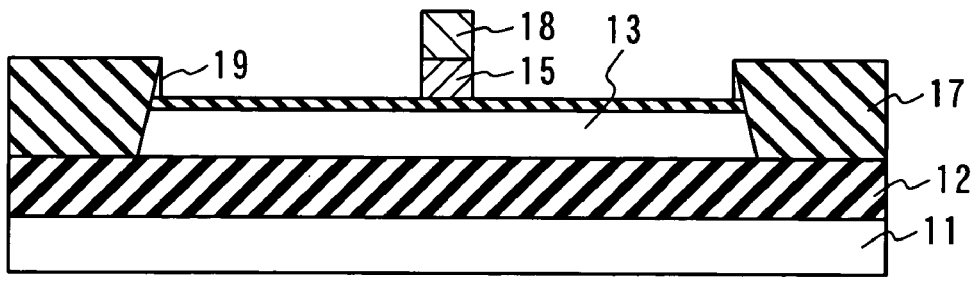
FIG. 20C is still another step order sectional view showing a manufacturing method of a comparison example in the present invention.

Next, after the stopper nitride film 16 is patterned such that its end plane is vertical, the polysilicon film 15, the gate insulating film 14 and the silicon film 13 are patterned so as to be forward tapered (è is obtuse) to form the device isolation trench. Subsequently, the STI embedded insulating film 17 is deposited, and is flattened by the CMP method (FIG. 19C). Subsequently, for example, the same etching rate method is used to flatten the first polysilicon film 15 and the STI embedded insulating film 17 and then the second polysilicon film 18 is deposited (FIG. 20A). Subsequently, by using the plasma etching at the step of patterning the laminated polysilicon film, the lower portion of the end plane of the first polysilicon film 15 whose upper portion is covered with the STI embedded insulating film 17 is not etched because of the shielding effect of the STI embedded insulating film 17 so that the residual polysilicon 19 is generated (FIG. 20C). This results in the generation of a leak current between the gate electrodes parallel to each other and the increase in the parasitic capacitance at the gate electrode and the like, since this residual polysilicon 19 is connected to the gate electrode.

As described in this comparison example, if the device isolation trench is formed to be forward tapered, the residual polysilicon 19 is generated. Thus, this is not desirable. Also, in SOI-MISFET of a short channel, there may be a case of generation of a leak current since a drain electric field is concentrated at a lower corner of an end of an element region. However, if the silicon film 13 is also formed to be reverse tapered and the lower corner of the end of the element region is formed to be obtuse, the electric field is not easily concentrated. That is, if the device isolation trench has the reverse tapered shape, this is desirable since the generation of the leak current can be suppressed.

In the semiconductor device of the present invention, the polysilicon film for the gate electrode adjacent to the device isolation trench is formed to be reverse tapered. Thus, when the gate electrode is formed, it is possible to previously prevent the generation of the residual polysilicon. Also, it is possible to suppress the generation of the leak current between the gate electrodes and the increase in the parasitic capacitance at the gate electrode. Also, the device isolation insulating film is formed to cover the side of the silicon film and to protrude from the silicon film. Therefore, it is possible to suppress the increase in the leak current and to suppress the occurrence of the reverse narrow channel effect. Moreover, since the silicon film is also formed to be reverse tapered, it is possible to relax the concentration of the electric field and thereby reduce the leak current.

Also, in the manufacturing method according to the present invention, the HF process is not carried out at any step. Thus, it is possible to remove the residual polysilicon caused by the over-etching of the embedded oxide film. It is possible to previously prevent the electric short circuit between the gate electrode and the source and drain regions, the generation of the leak current between the gate electrodes and the increase in the parasitic capacitance at the gate electrode and the like. Also, since the photolithography step of forming the gate electrode is carried out on the flat surface, it is possible to prevent the generation of the residual polysilicon and also possible to carry out the patterning at the high accuracy.

INDUSTRIAL APPLICABILITY

The MISFET formed on the SOI substrate is expected to be the ULSI device of the sub 100 nm generation, since as compared with the conventional MISFET formed on the bulk substrate, it has the low junction capacitance and the small substrate bias effect and the excellent sub-threshold effect.

The invention claimed is:

1. A method of manufacturing a semiconductor device comprising:

sequentially forming a gate insulating film, a first conductive layer and a first insulating film on a semiconductor layer provided on an insulating film;

selectively removing said semiconductor layer, said gate insulating film, said first conductive layer and said first insulating film to form a device isolation trench;

forming a second insulating film in said device isolation trench, wherein a height of an upper surface of said second insulating film is substantially coincident with that of an upper surface of said first insulating film;

removing a part of said second insulating film and said first insulating film such that a height of an upper surface of the exposed first conductive layer is substantially coincident with that of the top surface of the second insulating film; and patterning said first conductive layer to form a gate electrode, wherein said selectively removing is carried out such that an angle between a side plane and a bottom plane in said first conductive layer is obtuse.

2. The method of manufacturing the semiconductor device according to claim 1, wherein said selectively removing is carried out such that an angle between a side plane and a bottom plane in said first conductive layer and an angle between a side plane and a bottom plane in said semiconductor layer are both obtuse.

3. The method of manufacturing the semiconductor device according to claim 1, wherein said second insulating film comprises a tapered sidewall at an area of an interface between said second insulating film and said first conductive layer.

4. A method of manufacturing a semiconductor device comprising:

sequentially forming a gate insulating film, a first conductive layer and a first insulating film on a semiconductor layer provided on an insulating film;

selectively removing said semiconductor layer, said gate insulating film, said first conductive layer and said first insulating film to form a device isolation trench;

forming a second insulating film in said device isolation trench, wherein a height of an upper surface of said second insulating film is substantially coincident with that of an upper surface of said first insulating film;

removing apart of said second insulating film and said first insulating film such that a height of an upper surface of the exposed first conductive layer is substantially coincident with that of the top surface of the second insulating film; and patterning said first conductive layer to form a gate electrode, wherein said selectively removing is carried out such that an angle between a side plane and a bottom plane in said first conductive layer and an angle between a side plane and a bottom plane in said semiconductor layer are both obtuse.

5. A method of manufacturing a semiconductor device comprising:
- sequentially forming a gate insulating film, a first conductive layer and a first insulating film on a semiconductor layer provided on an insulating film;
- selectively removing said semiconductor layer, said gate insulating film, said first conductive layer and said first insulating film to form a device isolation trench;
- forming a second insulating film in said device isolation trench, wherein a height of an upper surface of said second insulating film is substantially coincident with that of an upper surface of said first insulating film;
- removing a part of said second insulating film and said first insulating film such that a height of an upper surface of the exposed first conductive layer is substantially coincident with that of the top surface of the second insulating film; and
- patterning said first conductive layer to form a gate electrode,
- wherein said selectively removing is carried out such that an angle between a side plane and a bottom plane in said first conductive layer and an angle between a side plane and a bottom plane in said first insulating film are both obtuse.

6. A method of manufacturing a semiconductor device comprising:
- sequentially forming a gate insulating film, a first conductive layer and a first insulating film on a semiconductor layer provided on an insulating film;
- selectively removing said semiconductor layer, said gate insulating film, said first conductive layer and said first insulating film to form a device isolation trench;
- forming a second insulating film in said device isolation trench, wherein a height of an upper surface of said second insulating film is substantially coincident with that of an upper surface of said first insulating film;
- removing a part of said second insulating film and said first insulating film such that a height of an upper surface of the exposed first conductive layer is substantially coincident with that of the top surface of the second insulating film; and
- patterning said first conductive layer to form a gate electrode,
- wherein said selective removing is carried out by an etching using $HBr-Cl_2-O_2-SF_6$ system gas, such that at least one of said first conductive layer and said semiconductor layer comprises a tapered shape.

7. The method of manufacturing the semiconductor device according to claim 6, wherein said etching in said selective removing is carried out by controlling the inclinations of respective sides of said semiconductor layer, said gate insulating film, said first conductive layer and said first insulating film while adjusting a flow rate of $SF_6$.

8. A method of manufacturing a semiconductor device comprising:
- sequentially forming a gate insulating film, a first conductive layer and a first insulating film on a semiconductor layer provided on an insulating turn;
- selectively removing said semiconductor layer, said gate insulating film, said first conductive layer and said first insulating film to form a device isolation trench;
- forming a second insulating film in said device isolation trench, wherein a height of an upper surface of said second insulating film substantially coincident with that of an upper surface of the first insulating film;
- removing said first insulating film to expose a surface of said first conductive layer;
- depositing a second conductive layer on said first conductive layer and said second insulating film;
- flattening said second conductive layer; and
- patterning said second conductive layer and said first conductive layer to form a gate electrode,
- wherein said selectively removing is carried out such that an angle between a side plane and a bottom plane in said first conductive layer is obtuse.

9. A method of manufacturing a semiconductor device comprising:
- sequentially forming a gate insulating film, a first conductive layer and a first insulating film on a semiconductor layer provided on an insulating film;
- selectively removing said semiconductor layer, said gate insulating film, said first conductive layer and said first insulating film to form a device isolation trench;
- forming a second insulating film in said device isolation trench, wherein a height of an upper surface of said second insulating film substantially coincident with that of an upper surface of the first insulating film;
- removing said first insulating film to expose a surface of said first conductive layer;
- depositing a second conductive layer on said first conductive layer and said second insulating film;
- flattening said second conductive layer; and
- patterning said second conductive layer and said first conductive layer to form a gate electrode,
- wherein said selectively removing is carried out such that an angle between a side plane and a bottom plane in said first conductive layer and an angle between a side plane and a bottom plane in said semiconductor layer are both obtuse.

10. A method of manufacturing a semiconductor device comprising:
- sequentially forming a gate insulating film, a first conductive layer and a first insulating film on a semiconductor layer provided on an insulating film;
- selectively removing said semiconductor layer, said gate insulating film, said first conductive layer and said first insulating film to form a device isolation trench;
- forming a second insulating film in said device isolation trench, wherein a height of an upper surface of said second insulating film substantially coincident with that of an upper surface of the first insulating film;
- removing said first insulating film to expose a surface of said first conductive layer;
- depositing a second conductive layer on said first conductive layer and said second insulating film;
- flattening said second conductive layer; and
- patterning said second conductive layer and said first conductive layer to form a gate electrode,
- wherein said selectively removing is carried cut such that an angle between a side plane and a bottom plane in said first conductive layer and an angle between a side plane and a bottom plane in said first insulating film are both obtuse.

11. A method of manufacturing a semiconductor device comprising:
- sequentially forming a gate insulating film, a first conductive layer and a first insulating film on a semiconductor layer provided on an insulating film;
- selectively removing said semiconductor layer, said gate insulating film, said first conductive layer and said first insulating film to form a device isolation trench;
- forming a second insulating film in said device isolation trench, wherein a height of an upper surface of said second insulating film substantially coincident with that of an upper surface of the first insulating film;

removing said first insulating film to expose a surface of said first conductive layer;

depositing a second conductive layer on said first conductive layer and said second insulating film;

flattening said second conductive layer; and patterning said second conductive layer and said first conductive layer to form a gate electrode, wherein said selectively removing is carried out by an etching using HBr-Cl$_2$—O$_2$—SF$_6$ system gas.

12. The method of manufacturing the semiconductor device according to claim 11, wherein said etching in said selectively removing is carried out by controlling the inclinations of respective sides of said semiconductor layer, said gate insulating film, said first conductive layer and said first insulating film while adjusting a flow rate of SF$_6$.

13. A semiconductor device, comprising:

a semiconductor layer formed on an insulating film, wherein said insulating film is not in contact with a conductive layer for a gate electrode, wherein a whole of device isolation insulating films formed on said insulating film are in contact with an insulator, and wherein an angle between a bottom plane of said semiconductor layer and a side of said semiconductor layer contacting said device isolation insulating film is obtuse.

14. A semiconductor device comprising:

a semiconductor layer having a channel region and source/drain regions which are formed by patterning in an island manner on an insulating film;

a gate electrode formed on said channel region of said semiconductor layer through a gate insulating film; and a device isolation insulating film formed on said insulating film to surround said semiconductor layer and having an upper surface protruding from an upper surface of said semiconductor layer, wherein a side plane of said semiconductor layer contacting a side plane of said device isolation insulating film is formed to be reverse tapered.

15. The semiconductor device according to claim 14, wherein a side plane of said semiconductor layer is formed to be reverse tapered.

16. The semiconductor device according to claim 14, wherein a gate wiring line is formed on said gate electrode.

17. The semiconductor device according to claim 14, wherein a gate wiring line is formed to contact an upper surface of said gate electrode and to extend to said upper surface of said device isolation insulating flim.

18. The semiconductor device according to claim 14, wherein said gate electrode comprises a first conductive material layer and a second conductive material layer on said first conductive material layer.

19. The semiconductor device according to claim 14, wherein a height of said upper surface of said device isolation insulating film is substantially equal to that of an upper surface of said gate electrode.

20. The semiconductor device according to claim 14, wherein said insulating film and said semiconductor layer are a buried insulating film and a silicon film formed on the buried insulating film in a silicon-on-insulator (SOI) substrate, respectively.

* * * * *